(12) United States Patent
Maurino

(10) Patent No.: US 6,903,672 B1
(45) Date of Patent: Jun. 7, 2005

(54) APPARATUS FOR AND METHOD OF PERFORMING AN ANALOG TO DIGITAL CONVERSION

(75) Inventor: Roberto Sergio Matteo Maurino, Reading (GB)

(73) Assignee: Analog Devices, Inc., Norwood, MA (US)

( * ) Notice: Subject to any disclaimer, the term of this patent is extended or adjusted under 35 U.S.C. 154(b) by 52 days.

(21) Appl. No.: 10/448,694

(22) Filed: May 30, 2003

(51) Int. Cl.$^7$ ................................................ H03M 3/00
(52) U.S. Cl. ................................... 341/143; 341/155
(58) Field of Search ................................. 341/143, 155

(56) References Cited

U.S. PATENT DOCUMENTS 3,761,923 A * 9/1973 Downie ....................... 342/175
4,967,380 A * 10/1990 Szajnowski ................. 250/397

* cited by examiner

Primary Examiner—Brian Young
(74) Attorney, Agent, or Firm—Wolf, Greenfield & Sacks, P.C.

(57) ABSTRACT

A signal processing component is provided where a swapper 702 is provided upstream of real and imaginary processing elements 704 and 706 within a system for processing complex signals. A further swapper 710 is provided downstream of the elements 704 and 706. The swappers 702 and 710 operate in unison.

19 Claims, 20 Drawing Sheets

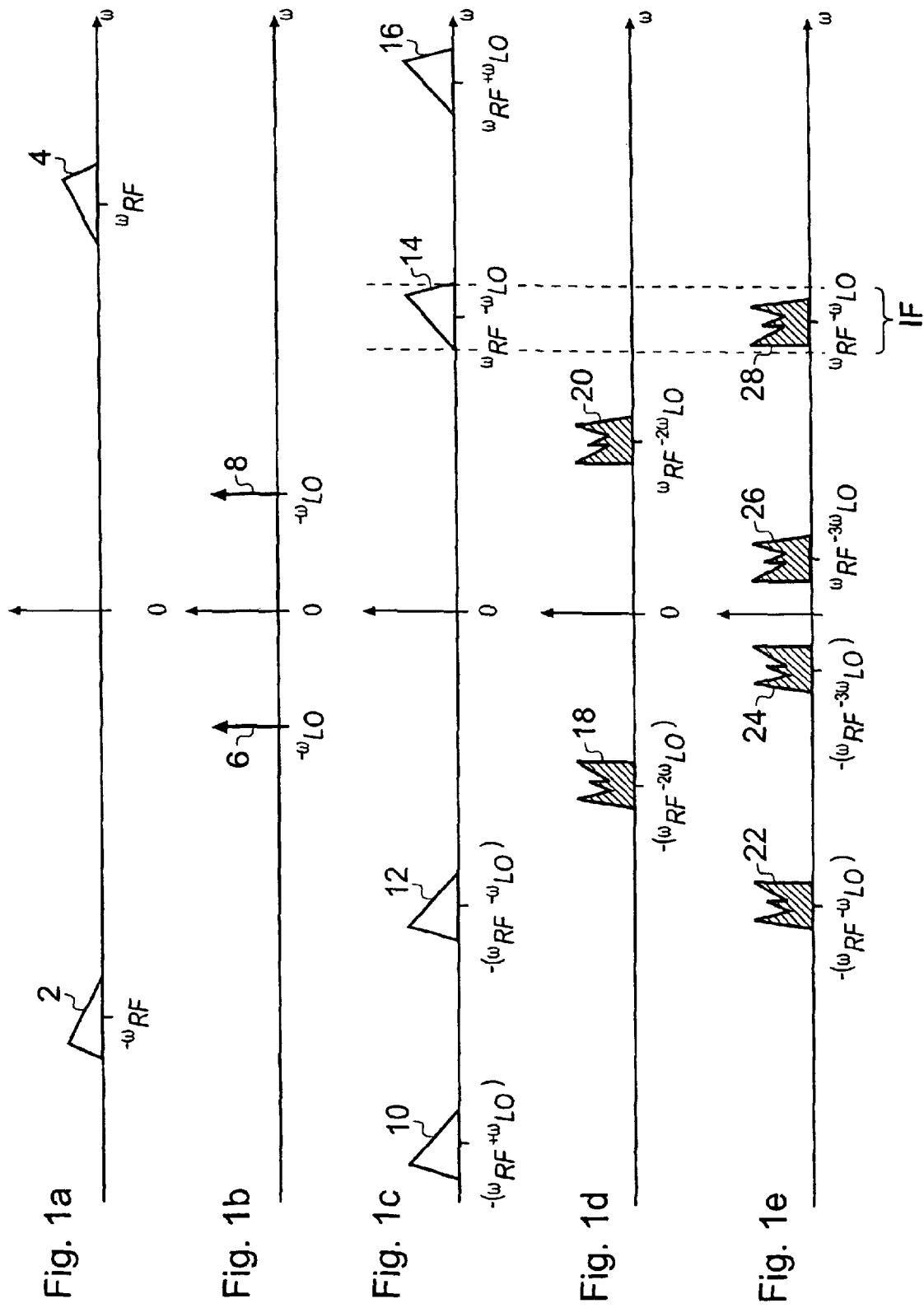

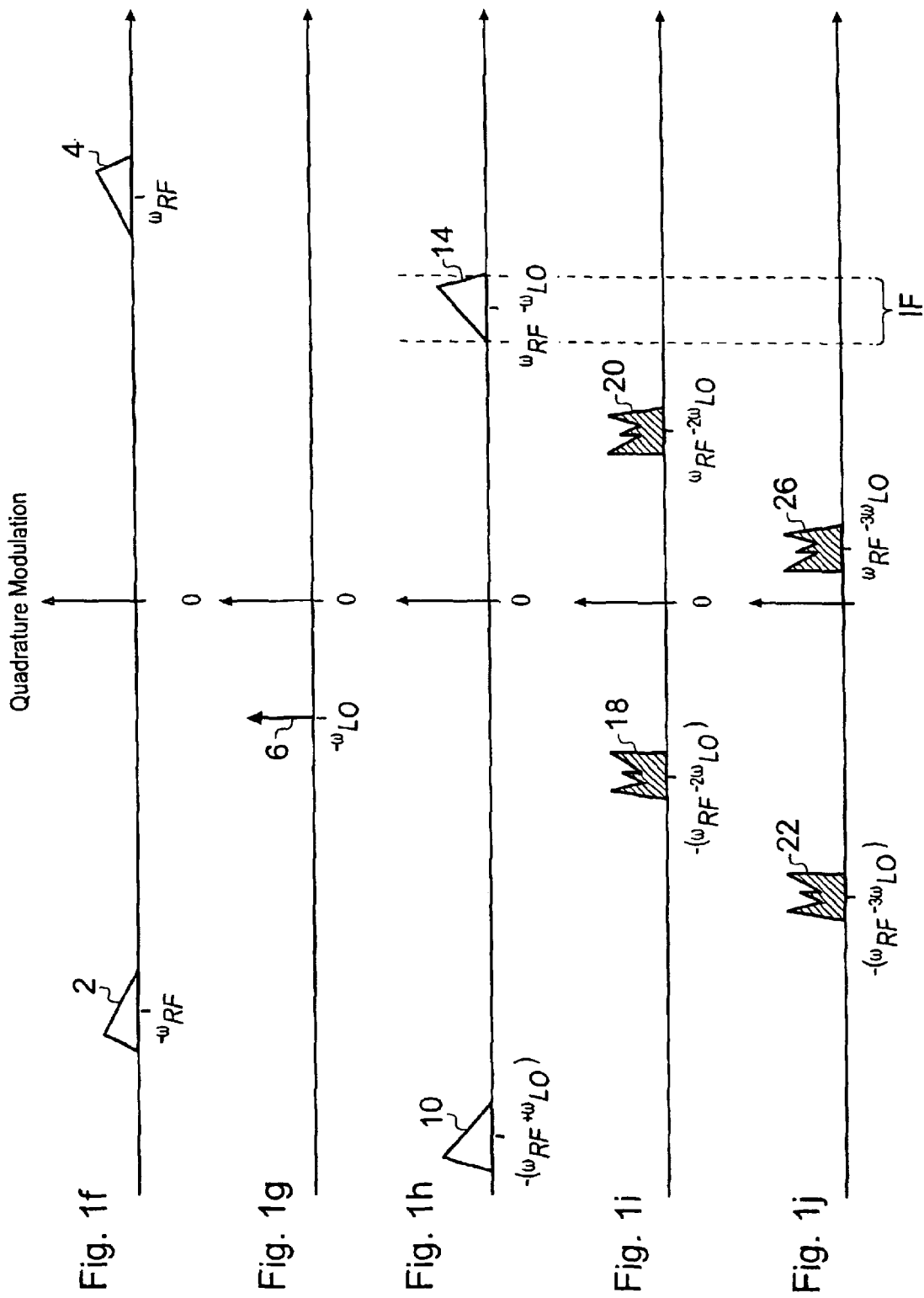

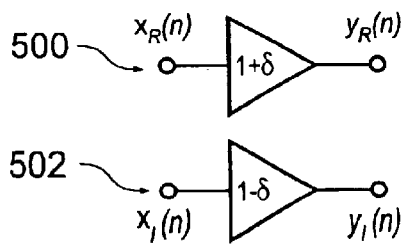
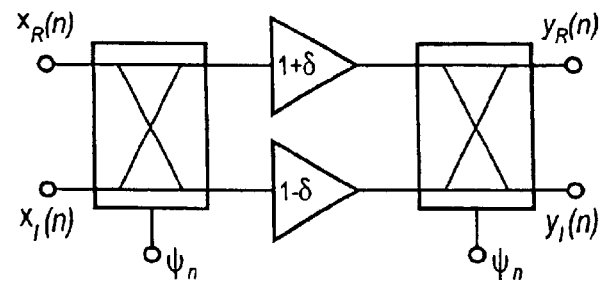
Fig. 8a  Fig. 8b
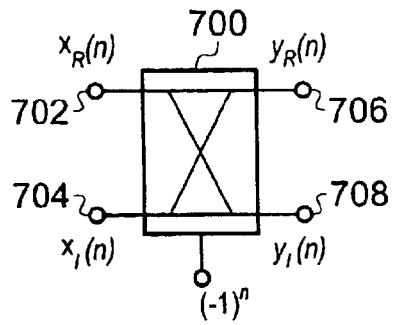
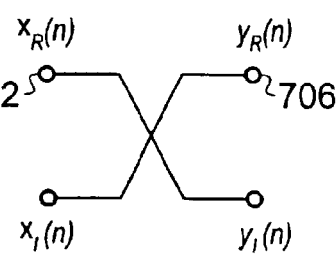
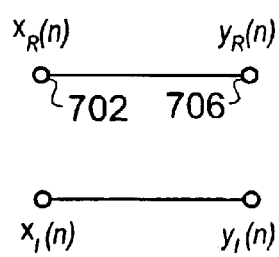
Fig. 10a  Fig. 10b  Fig. 10c
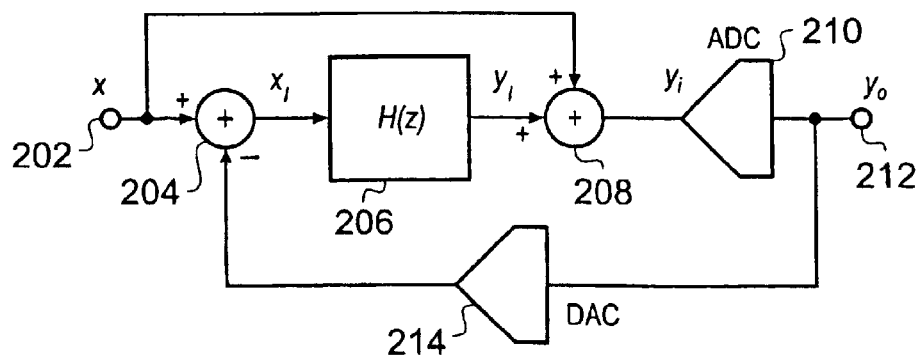
Fig. 2

Output spectrum of 2nd order complex modulator with non ideal integrators

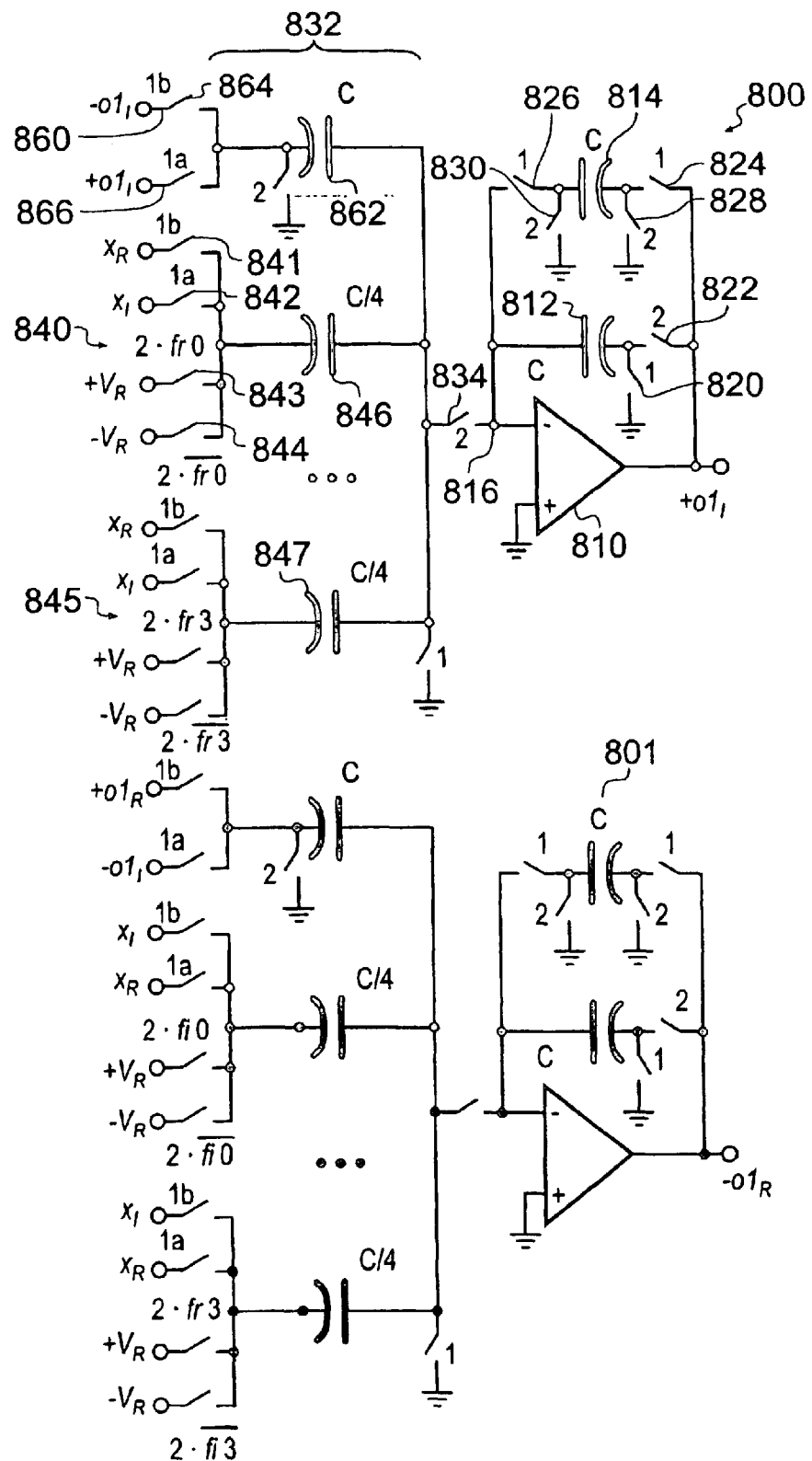
Fig.15 (continued on sheet 15/20)

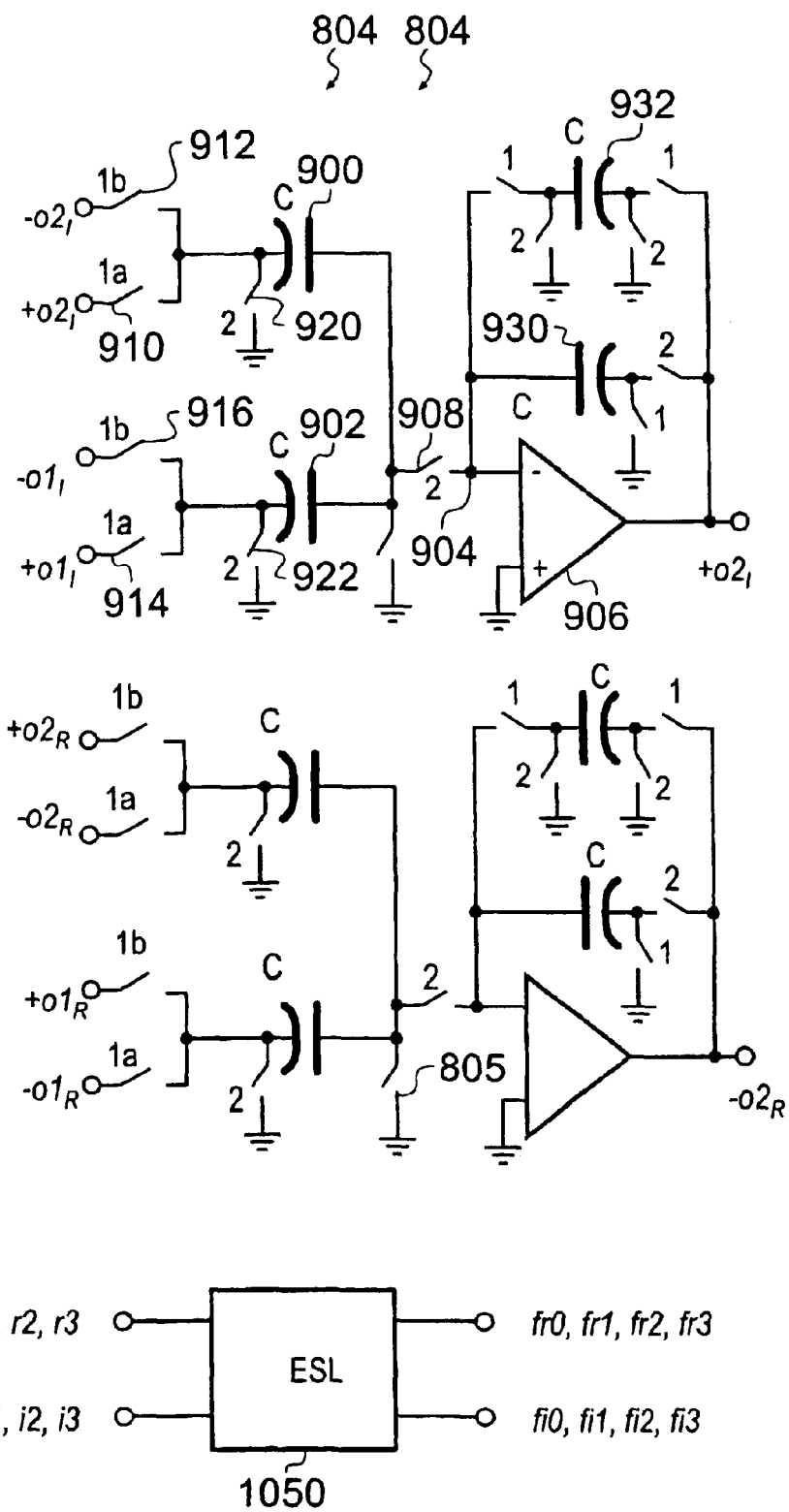
Fig. 15 (continued on sheet 16/20)

APPARATUS FOR AND METHOD OF PERFORMING AN ANALOG TO DIGITAL CONVERSION

TECHNICAL FIELD

The present invention relates to an apparatus for and a method of performing an analog to digital conversion. In particular the present invention provides an apparatus where the conversion is centred around an intermediate frequency. A quadrature frequency converter is used to frequency shift to the intermediate frequency as this enables noise power within the pass band to be reduced.

BACKGROUND TO THE INVENTION

The image rejection and noise improvement achieved by using a quadrature frequency converter in association with a quadrature analog to digital converter can be compromised by channel gain mismatches. However, the inventor has realised that these mismatches can be rendered substantially or wholly unimportant.

SUMMARY OF THE INVENTION

According to a first aspect of the present invention there is provided a signal processing apparatus having first and second signal processing channels, the first and second channels having gain element pairs therein which are substantially matched between the first and second channels, and wherein gain elements in the first and second channels which form a substantially matched pair between the first and second channels are preceded by a first gain element swapper and followed by a second gain element swapper, wherein the first and second gain element swappers are operated so as to alternatively swap the substantially matched pair of gain elements between the first and second channels.

The present invention utilises the technique of effectively repeatedly swapping part of the signal path of a channel into the other channel to provide dynamic element matching between the channels of the signal processing apparatus.

The dynamic matching reduces the effect of path mismatch, namely it reduces aliasing in the signal band of the mirror image of the signal and, in the case of an analog to digital converter, of the quantization noise.

Preferably each gain element which is mirrored in the channels (ie. if a specific device occurs in channel 1 then the same or functionally equivalent device also occurs in channel 2 in the absence of any gain element swappers) is preceded and succeeded by channel gain element swappers.

In this context a gain element is any component or device which causes the gain of the signal to be varied. Such gain variations include frequency dependent gain variations and can also apply to devices operating in the digital as well as the analog domains.

Although it is preferable to have each and every gain element preceded and succeeded by its own pair of swappers, it is possible to group gain elements into functional blocks and the block is placed between a pair of channel swappers rather than each and every element. Additionally and/or alternatively it is possible to identify swappers which are effectively redundant due to the circuit configuration and the presence of other swappers.

Preferably the signal processing apparatus is a sigma-delta analog to digital converter. Advantageously a filter is provided in the feedback loop of the converter so as to shape the quantization noise in the frequency domain.

Advantageously the signal provided to the input of the signal processing device is frequency shifted so as to be centred about a first frequency F1 and the filter in the feedback loop of the filter is a band pass filter centred at the first frequency F1.

Preferably the swappers are operated at a second frequency, where the second frequency F2 is twice the first frequency F1, thereby causing any mirror image component of the quantization noise or signal due to mismatch to be frequency shifted away from the band of interest around F1. As a side effect, the operation of the swappers introduces a self image component which in many applications can be tolerated. However, a method to eliminate the signal self image component for an analog to digital converter is also provided.

According to a second aspect of the present invention there is provided a signal processing device having first and second processing devices and first and second signal channels, wherein the first and second processing devices are proceeded and followed by switching devices such that, in a repeated fashion, the first signal processing device is introduced into the first signal processing channel and the second signal processing device is introduced into the second processing channel, and then the first signal processing device is introduced into the second signal channel and the second signal processing device is introduced into the first signal channel.

According to a third aspect of the present invention there is provided a method of processing complex signals in a signal processing circuit having a first channel and a second channel for "real" and "imaginary" parts of the signal, and wherein the effects of channel mismatch are reduced by repeatedly swapping signal paths in the first and second channels such that a signal processing element belongs to the first channel and the second channel in an alternating manner.

BRIEF DESCRIPTION OF THE DRAWINGS

The present invention will further be described by way of example with reference to the accompanying drawings in which:

FIG. 1 shows a series of frequency spectra, and in particular:

FIG. 1a shows the frequency spectrum of a received RF signal;

FIG. 1b shows the frequency spectrum of a non-complex local oscillator;

FIG. 1c shows the frequency spectrum after the mixing process;

FIG. 1d shows an interferer signal, sitting at an image frequency;

FIG. 1e shows the result of mixing the interferer signal with the local oscillator;

FIG. 1f shows the frequency spectrum of the incoming RF signal again;

FIG. 1g shows the frequency spectrum from a complex local oscillator;

FIG. 1h shows the result of mixing the RF signal with the complex local oscillator signal;

FIG. 1i illustrates an interferer signal, sitting at the image frequency $|\omega_{RF}-2\omega_{LO}|$, and FIG. 1j shows that the interferer signal at $\omega_{RF}-2\omega_{LO}$ is not mixed into the pass band of the IF stages.

FIG. 2 schematically illustrates the topology of a quadrature sigma-delta modulator;

FIG. 7 illustrates the frequency spectra within the converter of FIG. 6, and more specifically FIG. 7b shows the complex conjugate of the noise spectrum of FIG. 7a;

Figure 7A:
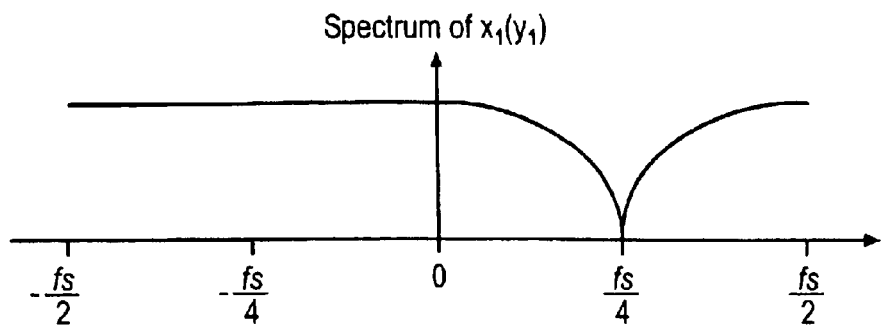
FIG. 7a shows the noise spectrum of a signal designated x1 at the input of the loop filter of the converter.
Figure 7B:
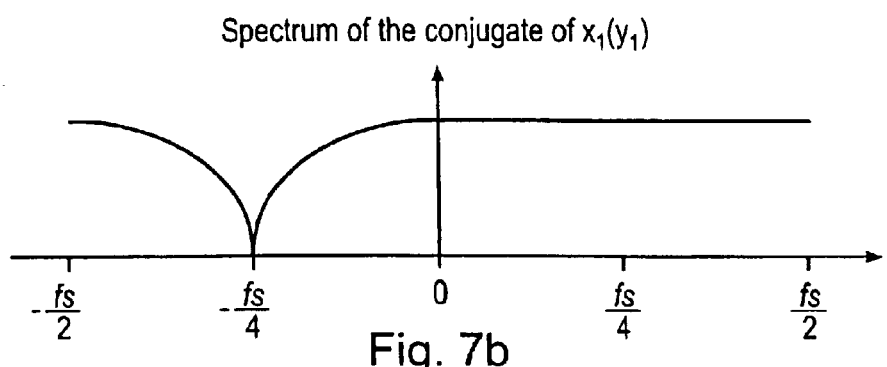
Figure 7C:
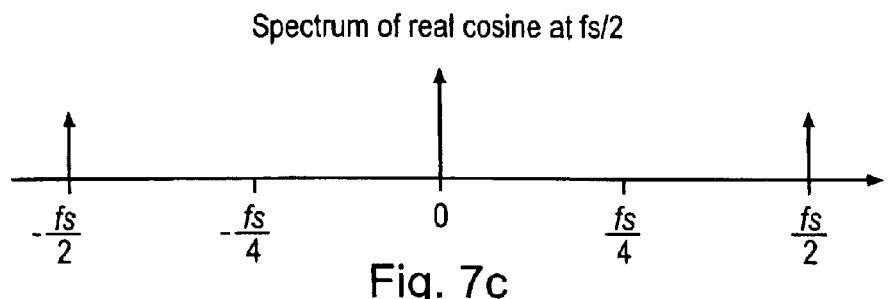
FIG. 7c shows the frequency spectrum of a real cosine having a frequency $$\frac{Fs}{2};$$
Figure 7D:
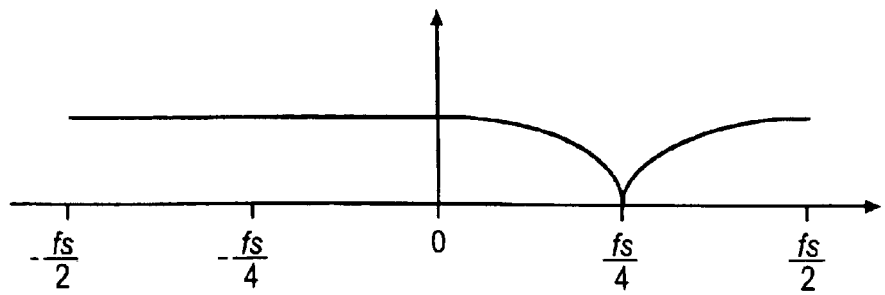
FIG. 7d shows the result of mixing the $$\frac{Fs}{2}$$

cosine with the conjugate of FIG. 7c.

FIG. 8 shows a unity gain element with mismatched channels.

Figure 6:
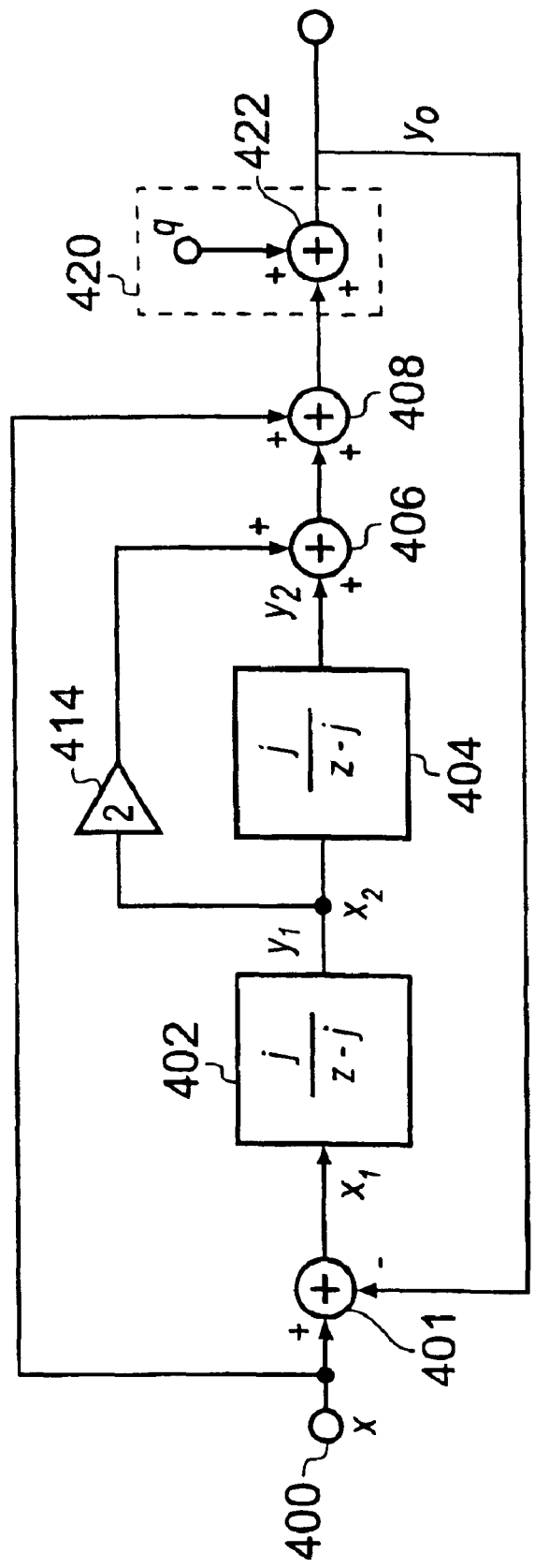
FIG. 6 illustrates a practical realisation of the circuit shown in FIG. 5.
Figure 9:
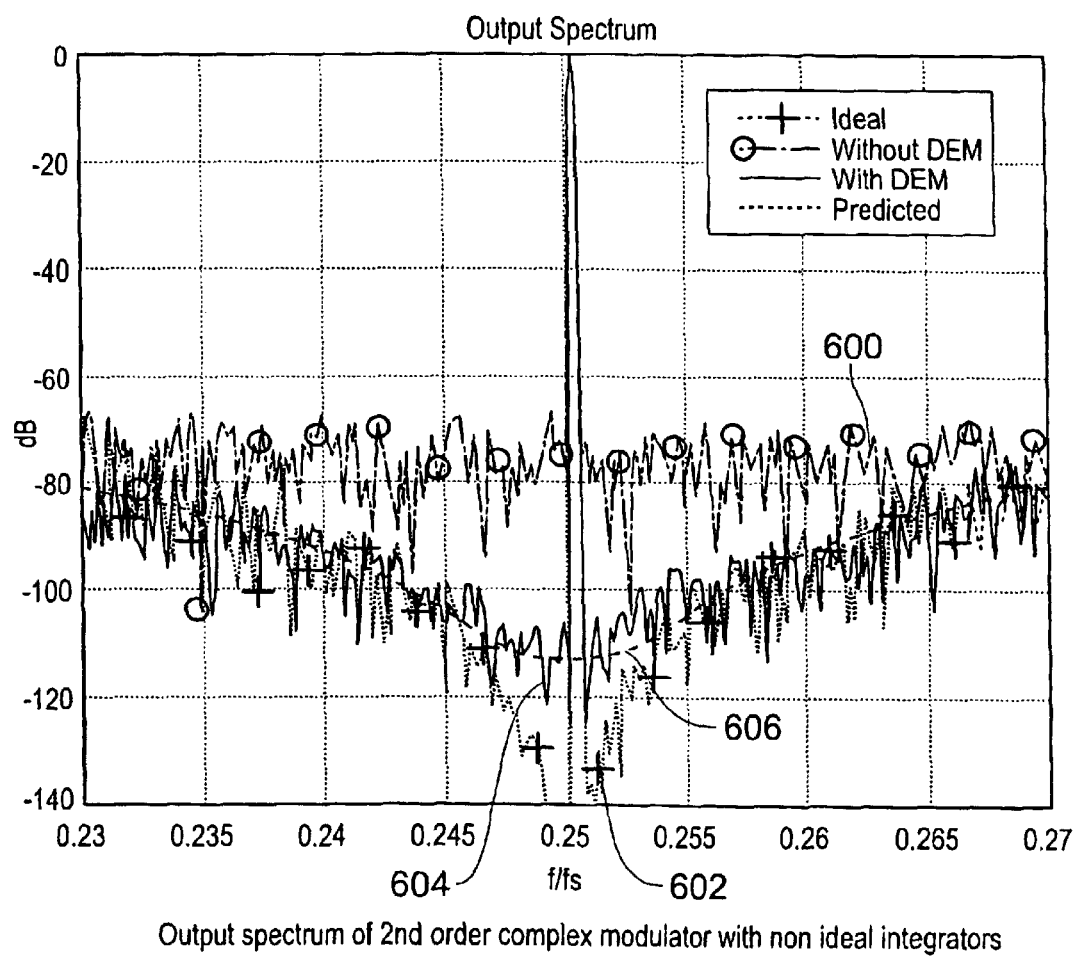
Figure 11:
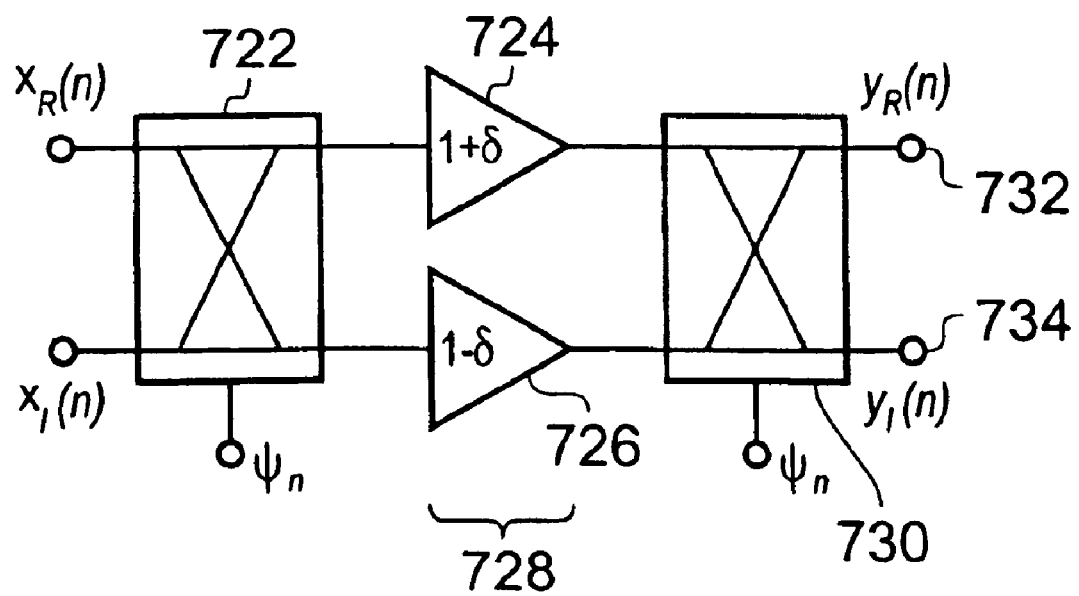
Figure 12:
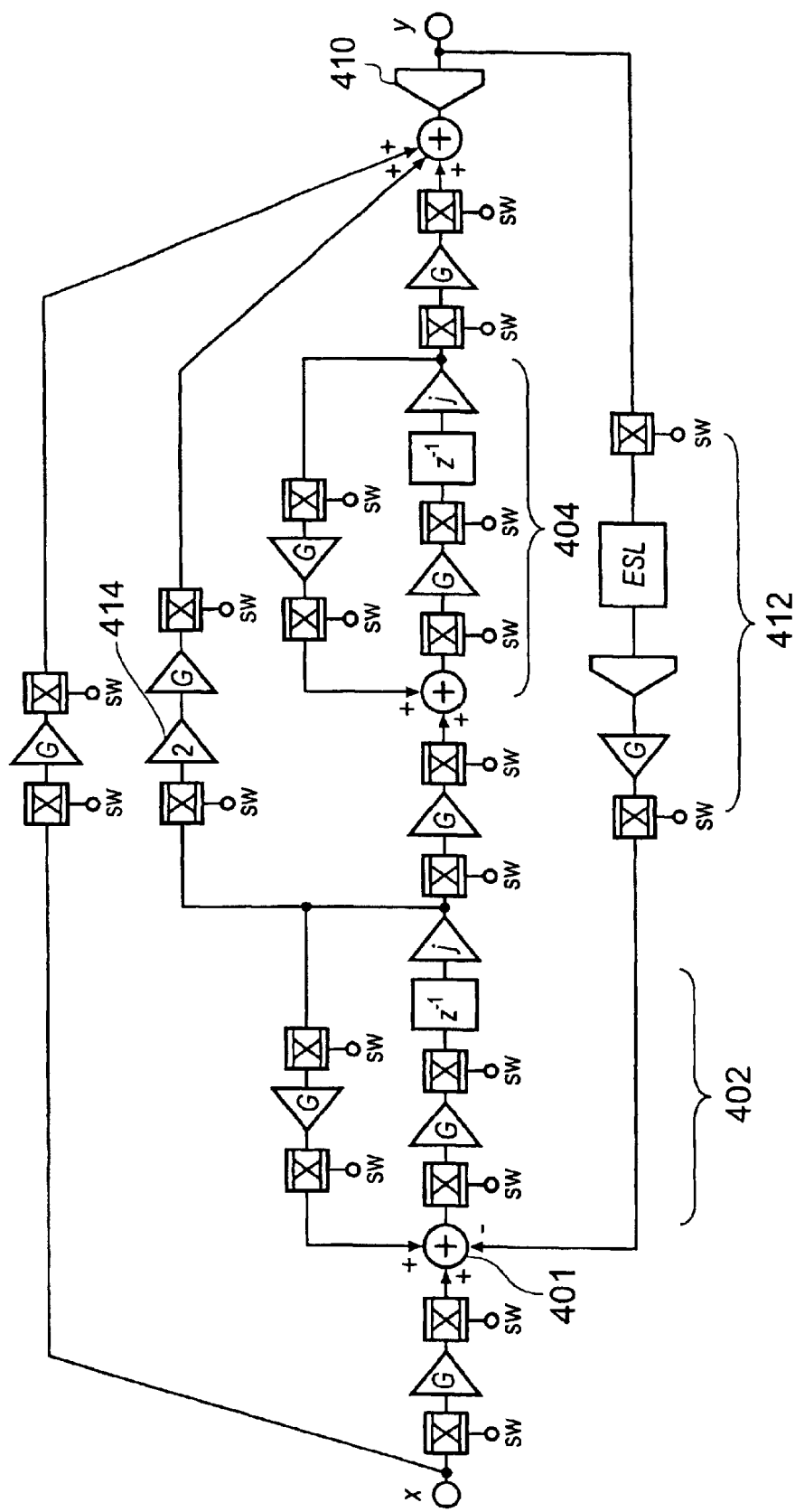
Figure 13A:
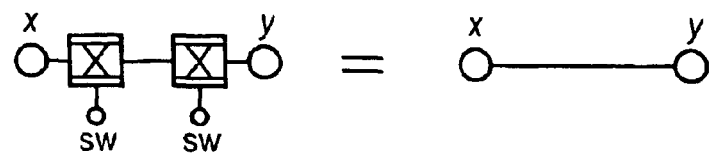
Figure 13B:
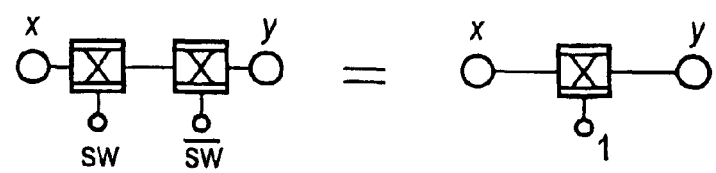
Figure 13C:
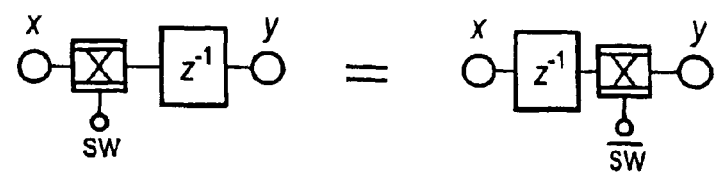
Figure 13D:
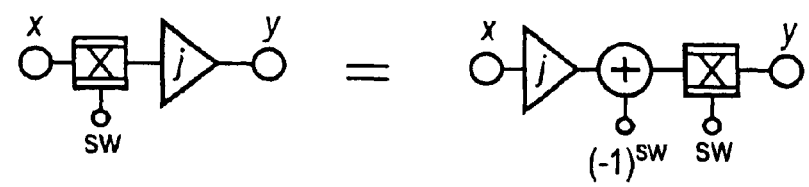
Figure 13E:
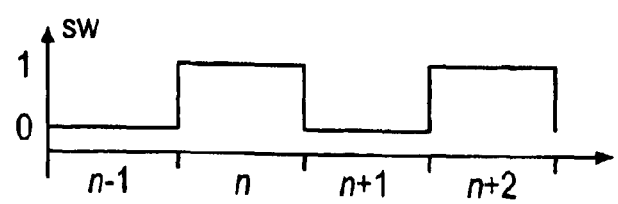
Figure 14:
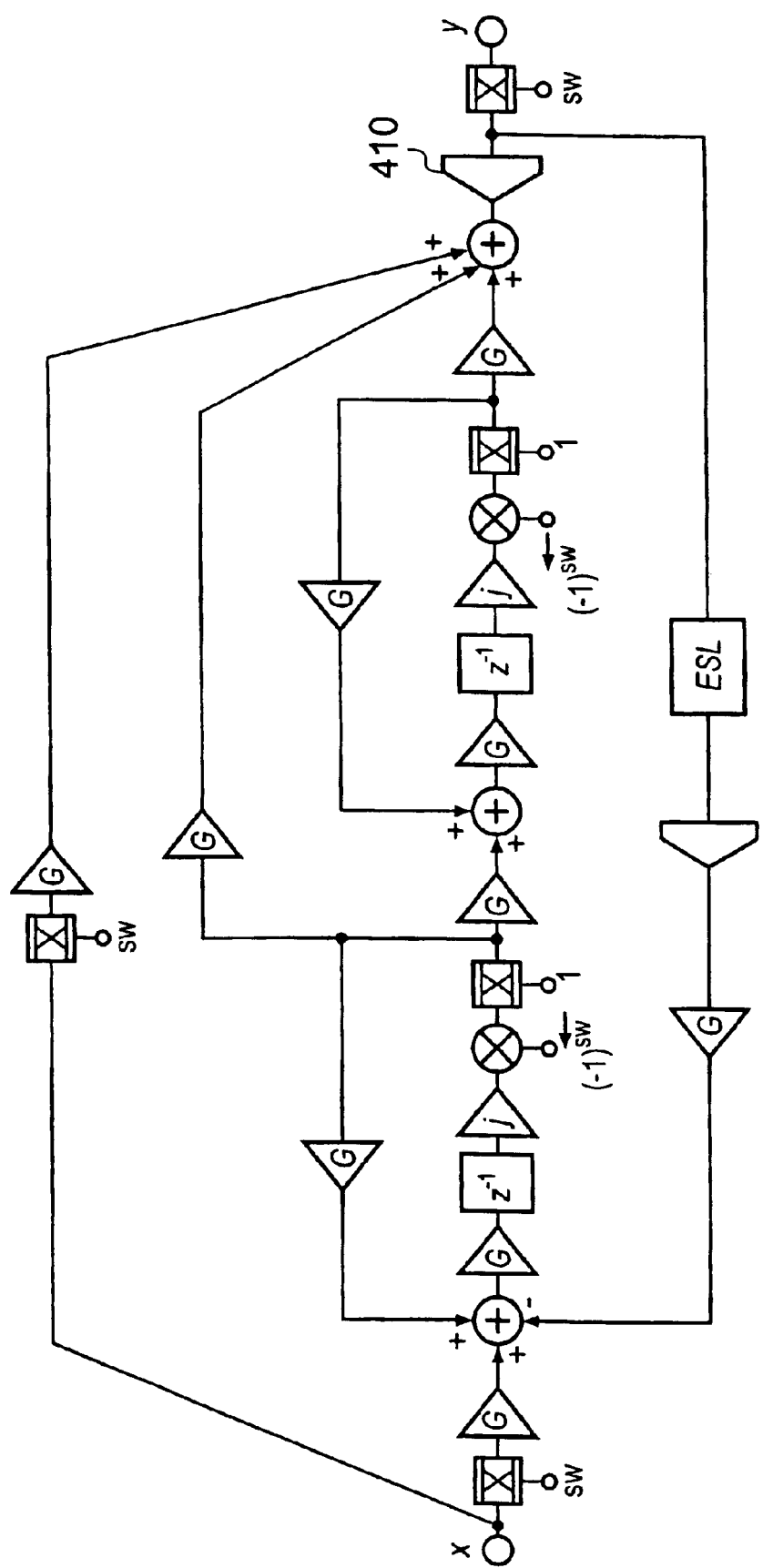
Figure 15:
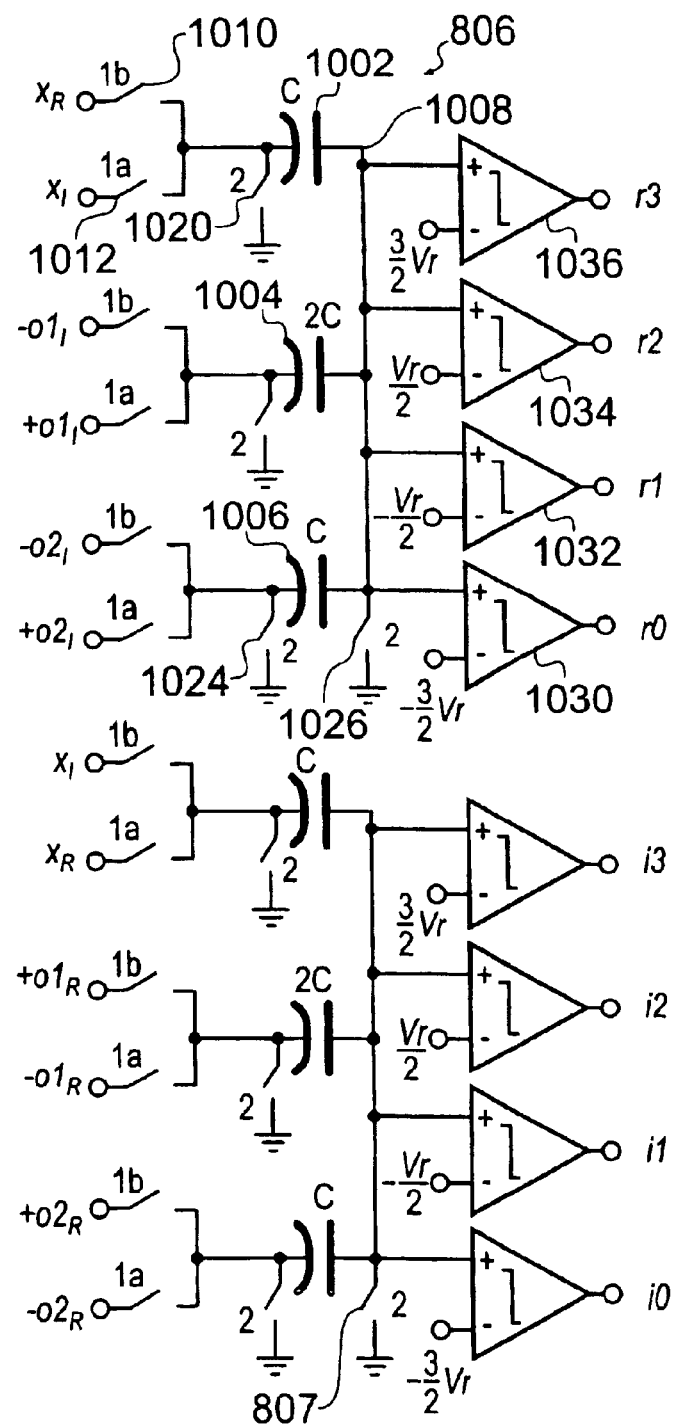
Figure 16:
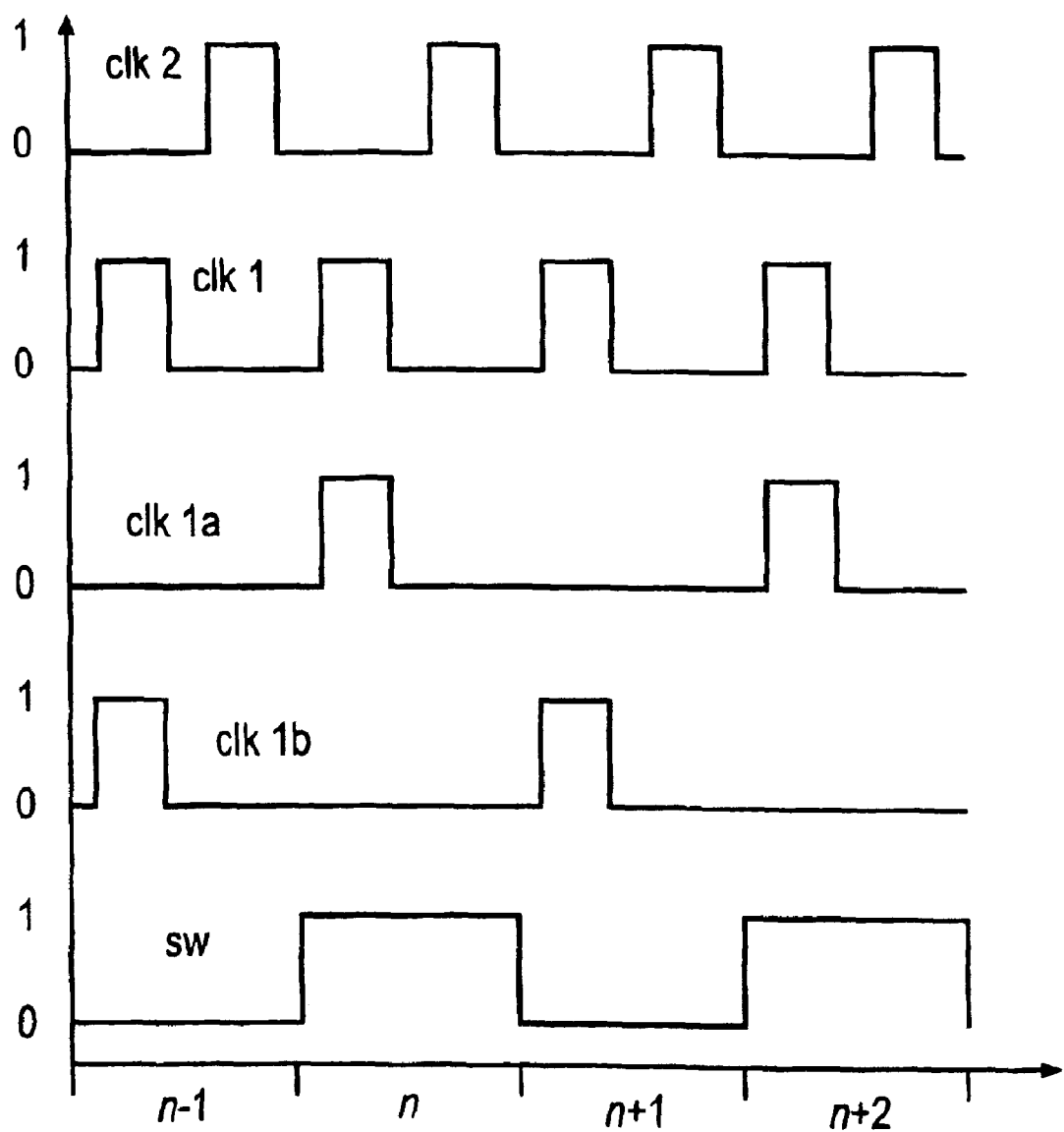
Figure 17A:
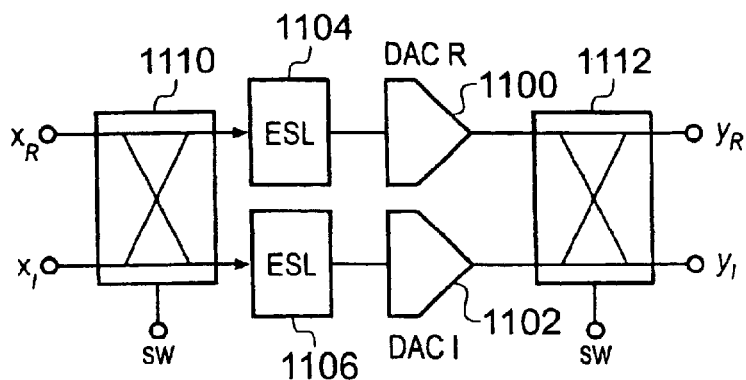
Figure 17B:
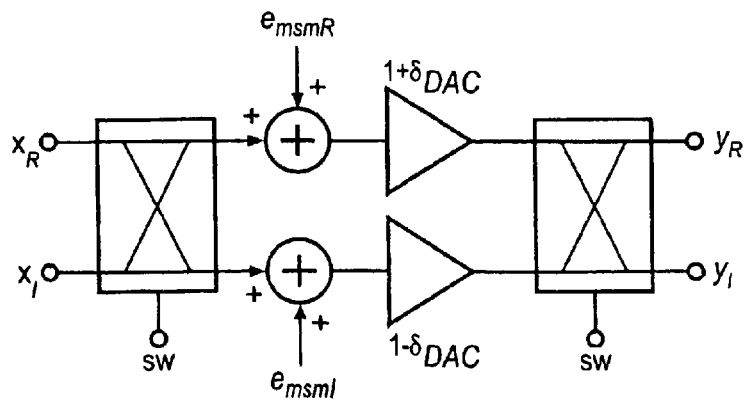
Figure 17C:
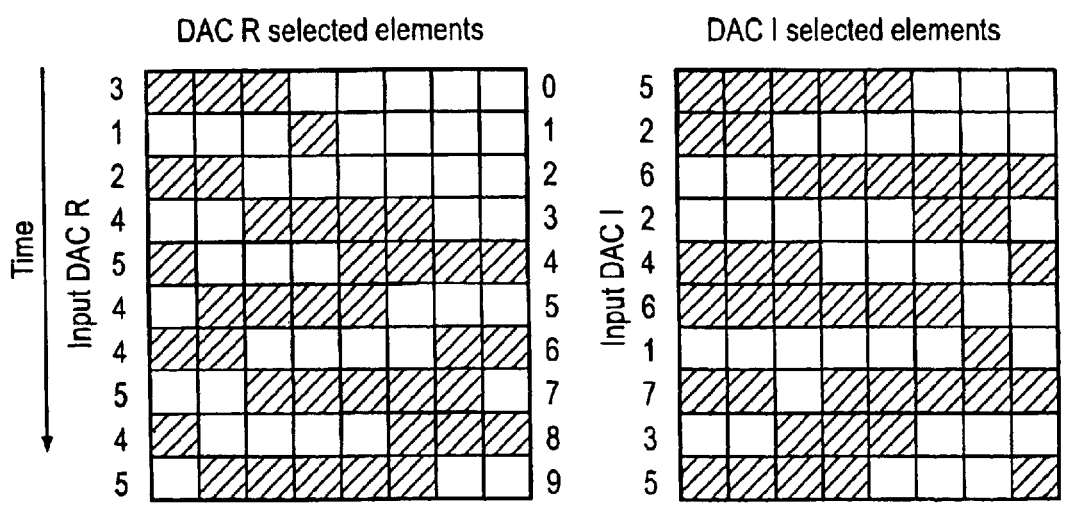
Figure 18A:
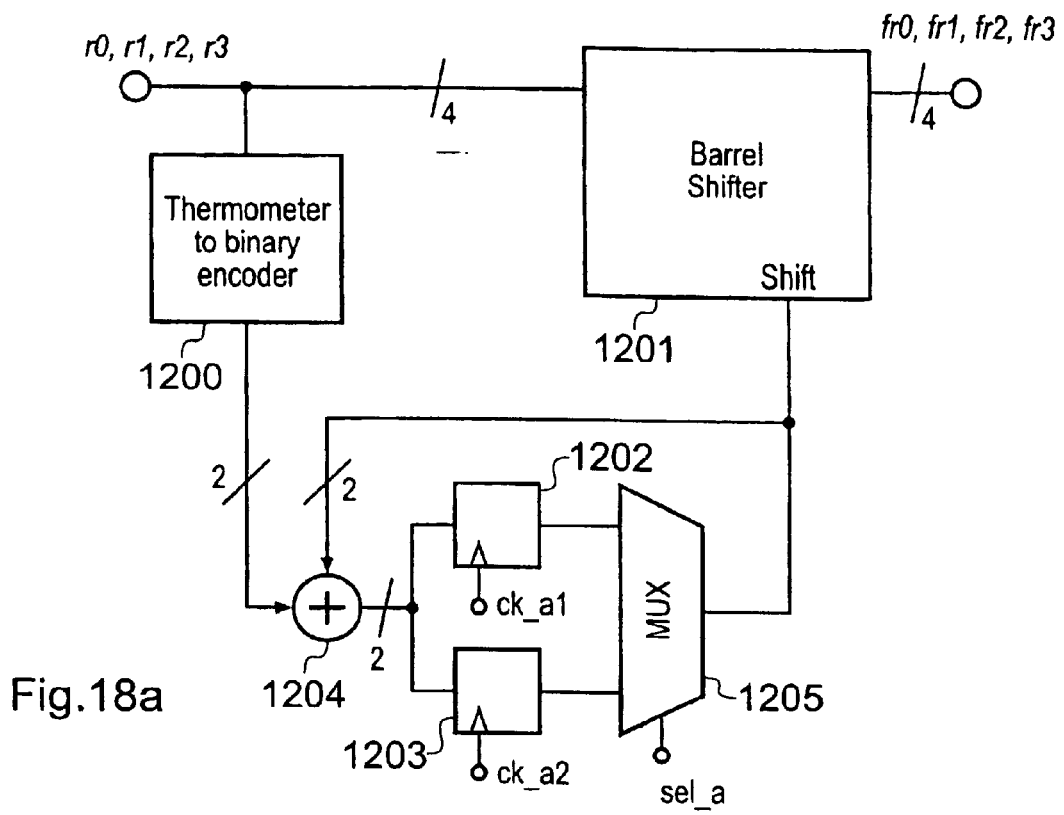
Figure 18B:
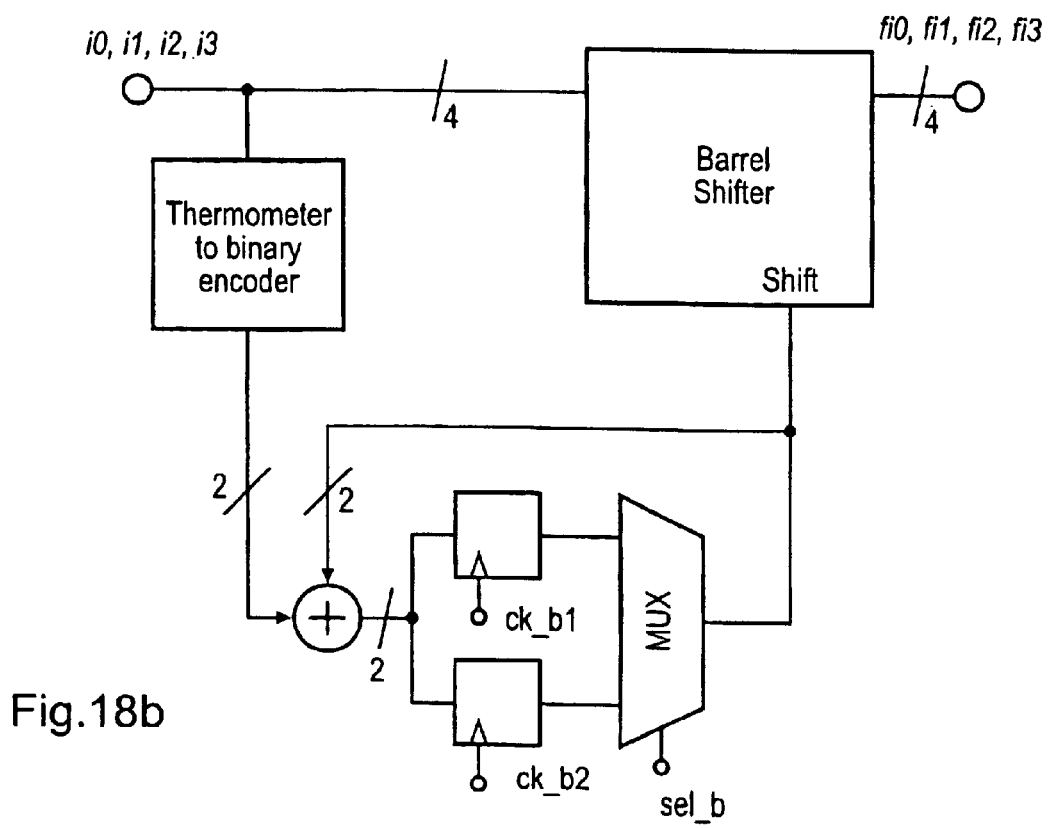
Figure 19:
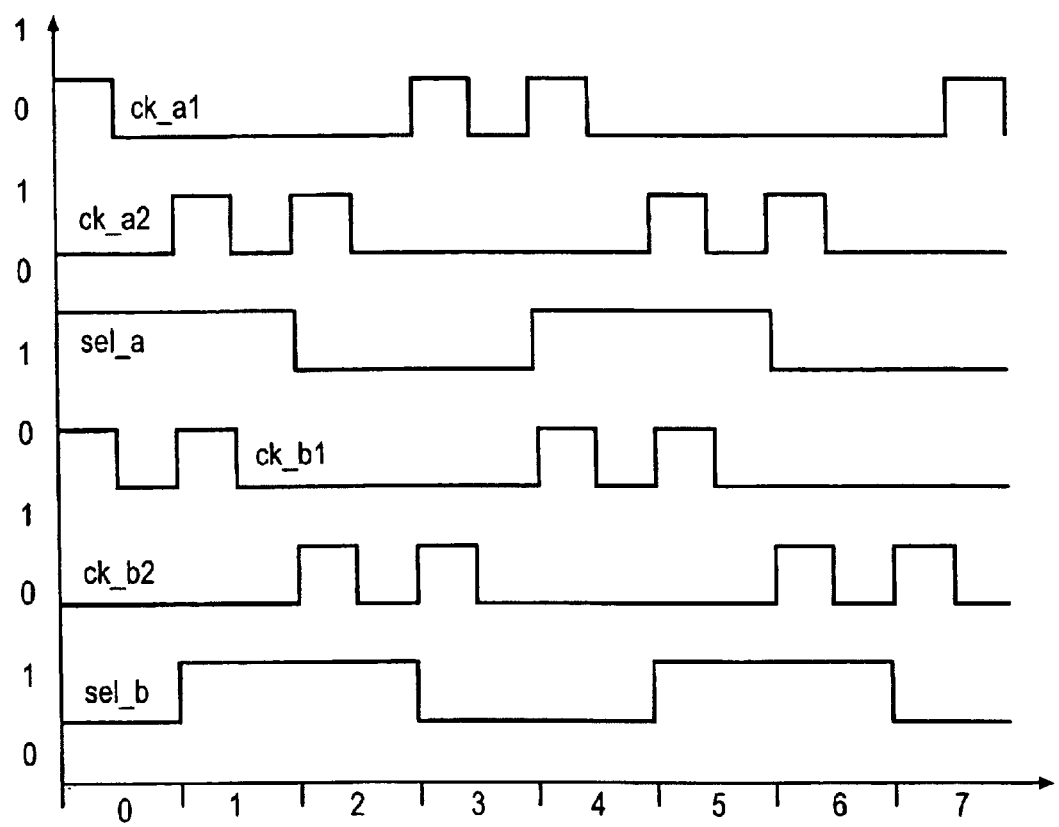

FIG. 9 shows the degradation in signal to noise ratio as a result of mismatch;

FIGS. 10a to 10c schematically show a swapper;

FIG. 11 shows a converter channel having two swappers constituting an embodiment of the present invention;

FIG. 12 is a circuit diagram of a physical realisation of the circuit shown in FIG. 6, wherein each swapper is shown;

FIGS. 13a to 13d schematically illustrate of swapper identities which can be used to simplify circuit design, and FIG. 13e shows the drive signal for the swappers;

FIG. 14 is a circuit diagram of the circuit shown in FIG. 12 once the swapper identities of FIG. 13 have been invoked to simplify the design;

FIG. 15 is a schematic diagram of A to D and D to A converter using switched capacitor technology;

FIG. 16 shows the clock signal for use in the circuit of FIG. 15;

FIG. 17a shows a DAC including an element selection logic block, FIG. 17b shows the circuit of FIG. 17a with the element selection logic (ESL) being modelled as an error source, and FIG. 17c shows a selection pattern implemented in the ESL block;

FIG. 18a and 18b illustrate a circuit for implementing the element selection block shown in FIG. 15; and FIG. 19 is a timing diagram for the circuit shown in FIG. 18.

DESCRIPTION OF PREFERRED EMBODIMENTS OF THE INVENTION

In radio frequency receivers it is well known to down convert the incoming signal from the incoming RF signal—which may occur anywhere in a relatively broad predefined frequency band to an intermediate frequency which is well defined. This has the advantage that amplifiers and filters can be designed to work only around the intermediate frequency. However, an "image signal" problem arises when mixing (frequency converting) an RF signal to the IF band.

It is well known that in complex notation a phasor can be arranged to rotate in a clockwise or a anticlockwise direction.

Thus $Y = e^{j\omega t} = \cos \omega t + j\sin \omega t$ is a positive frequency (anticlockwise rotation).

Whereas $Y = e^{-j\omega t} = +\cos \omega t - j\sin \omega t$ is a negative frequency (clockwise rotation).

Also, it can be seen that received signals which only have a "real" part when received are in fact the superposition of a signal having a positive frequency and one having a negative frequency since $$\cos \omega t = \frac{1}{2}e^{j\omega t} + \frac{1}{2}e^{-j\omega t}$$

It is also well known that mixing sinusoids results in the generation of the sum and difference frequencies, that is $$s(t)\cos\omega_{RF}t \cdot \cos\omega_{LO}t = \frac{s(t)}{2}\cos((\omega_{RF} - \omega_{LO})t) + \frac{s(t)}{2}\cos((\omega_{RF} + \omega_{LO})t)$$

where $s(t) \cos \omega_{RF} t$ is the wanted RF signal and $s(t)$ is its lowpass envelope (which generally represents the data which is carried on the carrier signal $\omega_{RF}$).

With reference to FIG. 1, the mixing problem for a real (non-complex) down converter will be considered.

FIG. 1a shows the frequency spectrum of a received RF signal having a frequency $\omega_{RF}$. In fact, from above, it is apparent that it really comprises two signal components 2 and 4 at $-\omega_{RF}$ and $+\omega_{RF}$ respectively.

It is desired to down convert the incoming signal to an intermediate frequency $\omega_{IF} = \omega_{RF} - \omega_{LO}$ by mixing with a local oscillator at a frequency $\omega_{LO}$. This is illustrated in FIG. 1b and can in fact as shown in FIG. 1b, be seen to comprise two signal components 6 and 8 at $-\omega_{LO}$ and $+\omega_{LO}$, respectively. The input stage can be expected to include band pass filters, so signals and noise away from $\omega_{RF}$ will become increasingly attenuated.

It can be seen in FIG. 1c that four images of the input signal are generated 10, 12, 14 and 16 of which only the image 14 at $\omega_{RF} - \omega_{LO}$ is wanted—although it may be argued that the image 12 is also the wanted signal as it will pass through the IF filters.

Now suppose that there is also an interferer signal at the image frequency present in the system, namely at $-(\omega_{RF} - 2\omega_{LO})$ and $(\omega_{RF} - 2\omega_{LO})$ as designated 18 and 20 in FIG. 1d. This interferer signal also mixes with the local oscillator at $-\omega_{LO}$ and $+\omega_{LO}$ to produce frequency converted noise signals 22, 24, 26 and 28 (shown in FIG. 1e) of which an interfering signal 28 caused by mixing local oscillator signal 8 with interferer signal 20 falls in the IF band. The image signal can be larger than the wanted signal and thus it might completely overcome the wanted signal.

It is known that this situation can be improved by using quadrature modulation. FIG. 1f shows the input signal at $\omega_{RF}$ and $-\omega_{RF}$ as shown in FIG. 1a. However, as shown in FIG. 1g the local oscillator is now arranged only to have a presence 6 at $-\omega_{LO}$. This mixes with the two signals 2 and 4. This gives rise to a frequency converted signal 10 at $-(\omega_{RF} + \omega_{LO})$ but also the mixing of $\omega_{LO}$ and $\omega_{RF}$ gives as the sum frequency a signal 14 in the IF $\omega_{RF} - \omega_{LO}$, as shown in FIG. 1h.

FIG. 1i shows again the image (interferer) signal at $-(\omega_{RF} - 2\omega_{LO})$ and $(\omega_{RF} - 2\omega_{LO})$, designated 18 and 20 respectively.

When the image signal mixes with the local oscillator $-\omega_{LO}$, this gives rise to shifted image signals 22 and 26, shown in FIG. 1j, both of which are outside of the IF band for the receiver. In particular the image 28 of FIG. 1e is not formed and hence the wanted signal is not corrupted. Thus quadrature modulation is advantageous.

FIG. 2 illustrates a configuration of a complex sigma-delta modulator. It will be appreciated that all the signals of such a modulator are complex, namely they are made up of two signals, the real part and the imaginary part. Thus the hardware is provided to handle the two parts—and this normally involves duplication of components for the real and imaginary parts, respectively. The sigma-delta modulator has an input node 202 connected to a non-inverting input of a summer 204 whose output is connected to the input of a filter 206. An output of the filter 206 is connected to a first non-inverting input of a second summer 208. A second non-inverting input of the second summer 208 is connected to the input node 202. An output of the second summer 208 is connected to an input of an analog to digital converter 210 which typically (but not necessarily) is a single bit converter. The output of the analog to digital converter 210 is provided to an output node 212 and also to an input of a digital to analog converter 214 whose output is supplied to an inverting input of the first summer 204.

Thus the summer 204 acts to form the difference between the input signal and the digitised output signal and hence the output of the summer 204 is a representation of the quantization noise, designated x1, produced by the converter. The quantization noise is filtered by the filter 206 and added to the input signal by the second summer 208. Thus the digital to analog converter 214, the first summer 204 and the filter 206 effectively form a feedback loop within the converter.

If the converter of the type shown in FIG. 2 is a first order converter, the feedback loop filter 206 is a complex integrator with a transfer function H(z) given by:

$$H(z) = \frac{j}{z-j} \quad (1)$$

Figure 3A:
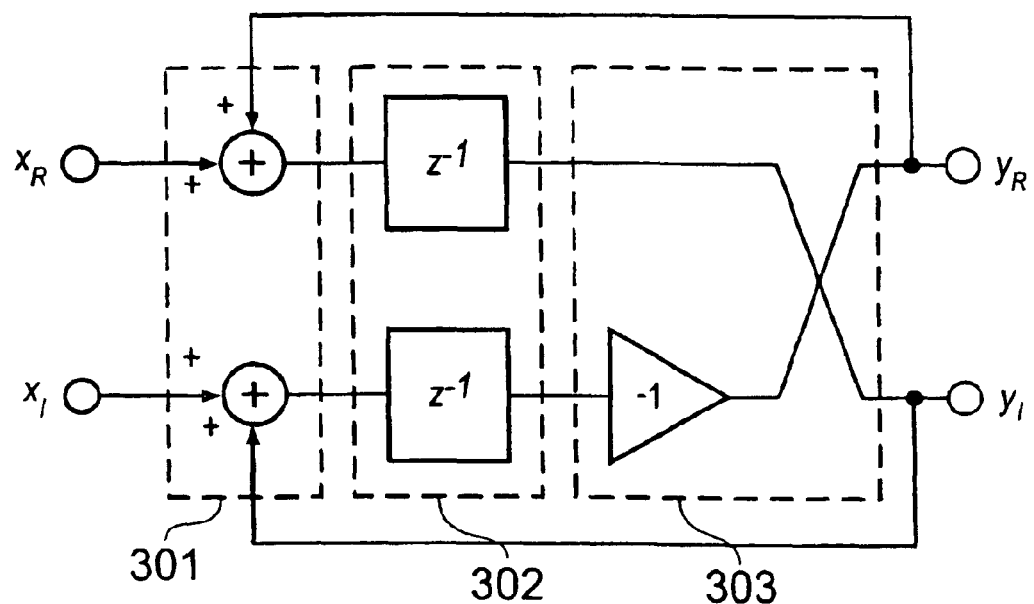
FIGS. 3a and 3b schematically illustrate a complex integrator.
Figure 3B:
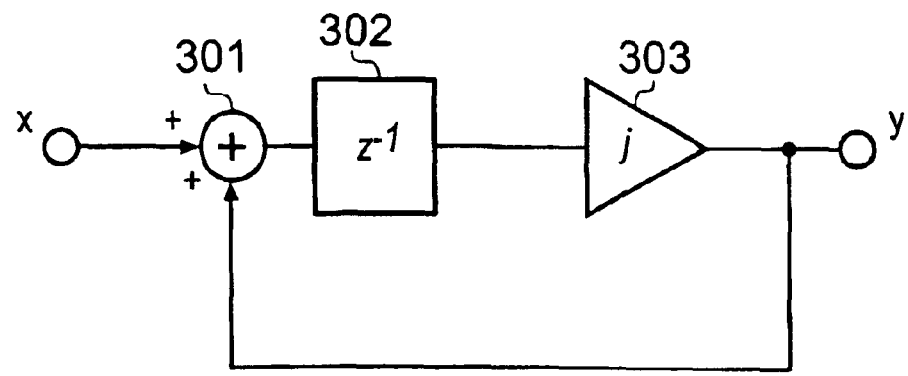

Higher order converters are obtained by cascading several integrators. The transfer function of a complex integrator could be achieved using the integrator topology shown in FIG. 3. FIG. 3a shows the real and imaginary paths in detail, while FIG. 3b is an equivalent more compact representation of the same complex integrator of FIG. 3a. A complex input signal X is provided to a first input of a summer 301 whose output is provided to an input of a delay block 302. An output of the delay block is provided to an input of a J multiplier 303. A complex output of the J multiplier 303 provides both an output Y of the integrator 206 and also an input to a second non-inverting input of the summer 301.

Such a configuration forms a complex integrator whose gain becomes infinite at $$\frac{F_s}{4},$$

where $F_S$ is the clock frequency of the sigma-delta converter.

Figure 4A:
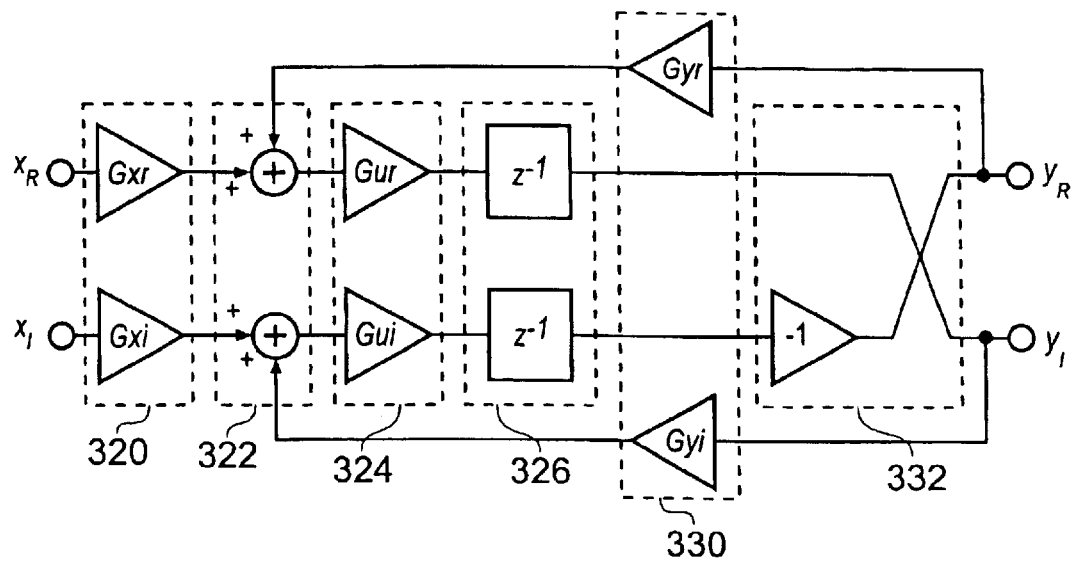
FIG. 4a shows a physical realisation of the complex integrator shown in FIG. 4b.
Figure 4B:
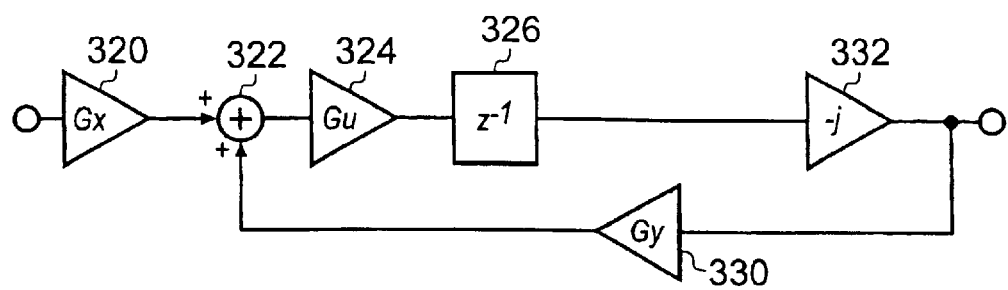
FIG. 4 illustrates an equivalent circuit to that shown in FIG. 3; an in particular
FIG. 4c shows that mismatch can be modelled as an error (e) introduced at the input to the integrator.

FIGS. 4a and b show a complex integrator of the type of FIG. 3 where path mismatch has been taken into account. The topology closely matches that shown in FIG. 3. However a gain element 320 is interposed between the input X and the summer 322 (representing summer 301 of FIG. 3) to represent gain mismatch to the input of the summer. A gain mismatch element 324 interposed between the output of the summer 322 and the inputs to delay elements 326 (representing delay element 302 of FIG. 3) represents gain mismatch between the summer and the delay element. Similarly a gain mismatch element 330 is provided to represent gain mismatch occurring in the feedback loop from the outputs to the second inputs of the summer 322. Again, FIG. 4b represents the same block diagram as FIG. 4a in a more compact way. It should be noticed that there are no mismatch path gains associated with the J multiplier 332 (equivalent to 303 in FIG. 3). This is because, as clearly shown in FIG. 4a, a J multiplier can be implemented by firstly changing the sign of the imaginary channel and then by swapping the real with the imaginary channel. These operations can be implemented without error in a differential system.

In an ideal situation, without mismatch, we would have:

$$Gxr=Gxi=Gyr=Gyi=Gur=Gui=1$$

Because of mismatch, in practice we have:

$$Gxr=1+\omega_x$$

$$Gxi=1-\omega_x$$

$$Gyr=1+\omega_y$$

$$Gyi=1-\omega_y$$

$$Gur=1+\omega_u$$

$$Gui=1-\omega_u$$

Figure 4C:
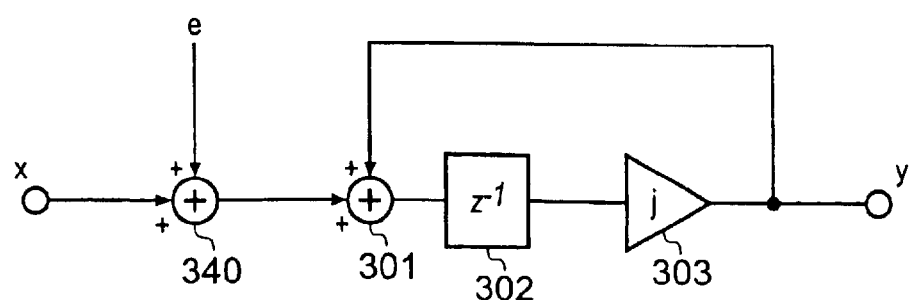

A complex integrator with mismatch can be modelled as an ideal complex integrator with an error e added to its input, as shown in FIG. 4c. FIG. 4c takes the arrangement shown in FIG. 3b (and with the channel gain mismatch included the configurations shown in FIGS. 4a and 4b) and includes means for modelling a mismatch error. The error e can be considered as being introduced via a further summer 340 interposed between the input X and the summer 301.

Figure 5:
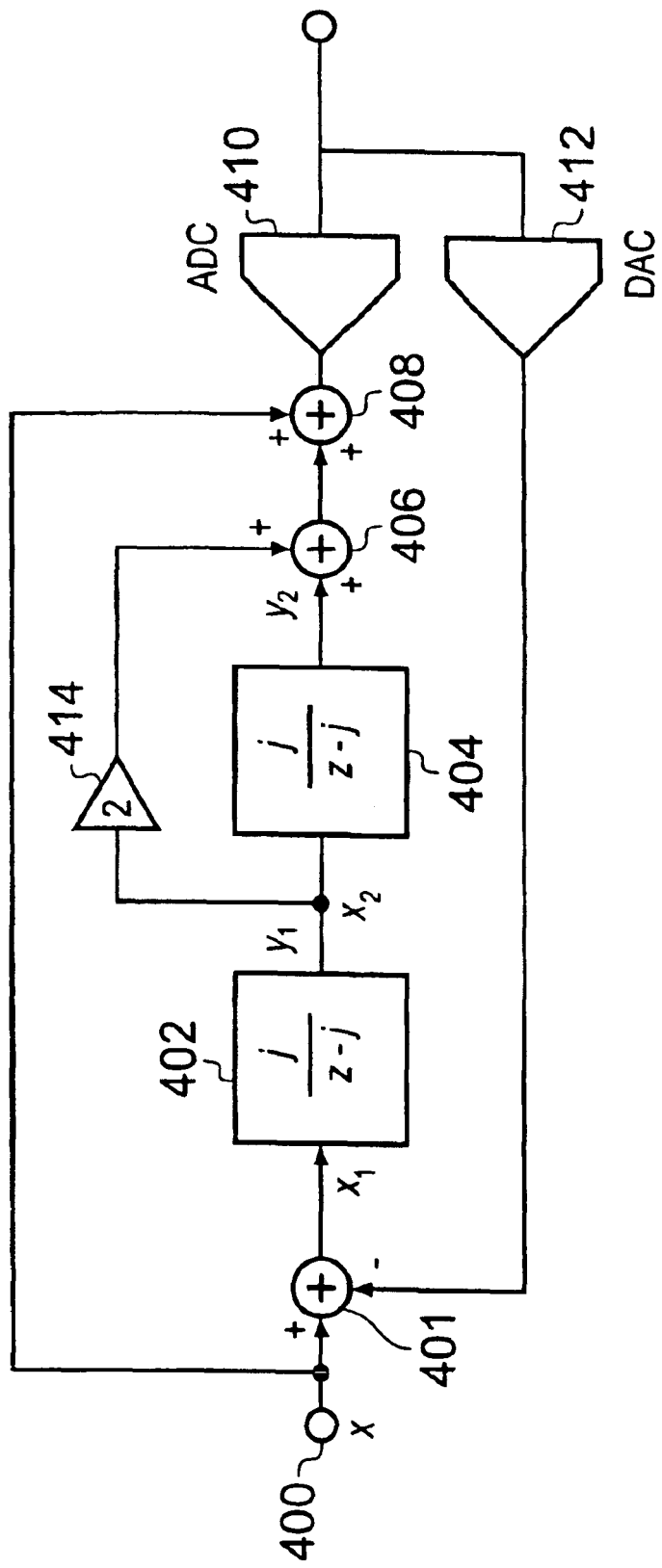
FIG. 5 illustrates a second order sigma-delta converter.

FIG. 5 schematically illustrates a second order converter topology. The circuit shown in FIG. 5 has a input node 400 connected to a non-inverting input of a first summer 401. An output of the summer 401 is provided to a complex integrator 402. The output of the complex integrator is provided to the input of a further complex integrator 404 whose output is connected to a first non-inverting input of a second summer 406. An output of the second summer 406 is provided to a first non-inverting input of a third summer 408 whose output is connected to the input of an analog to digital converter 410. The output of the analog to digital converter 410 represents the output of the sigma-delta converter. The output of the analog to digital converter 410 is connected to an input of a digital to analog converter 412 whose output is connected to an inverting input of the first summer 401. Additionally the output of the first integrator 402 is multiplied by two by a gain element 414 and supplied to a second non-inverting input of the second summer 406. Furthermore, the input signal and the input node 400 is also supplied to a second non-inverting input of the third summer 408.

The analog to digital converter 410 can be modelled as an error block 420 in which the quantization error Q is introduced via a further summer 422 and results in the equivalent circuit shown in FIG. 6.

If we consider the function of the first integrator 402 in the second order converter of FIGS. 5 and 6, it can be shown that the contribution to the output of the converter 406 of a mismatch error e1(n) injected at the input of the first integrator 402 is given by:

$$Y_0(z)=z^{-1}(2j-z^{-1})e_1(z) \quad (2)$$

The transfer function $z^{-1}(2j-z^{-1})$ has a modulus of 1 at $$\frac{F_s}{4}.$$

Thus, in the bandwidth of interest any disturbance introduced at the input of the first integrator appears unattenuated at the output of the converter.

For an ideal converter of the type of FIG. 6 the input of the first integrator is $$x_I(z)=(1-jz^{-1})^2 Q(z) \quad (3)$$

where Q is the quantization error, and its output is $$Y_I(z)=z^{-1}(1-jz^{-1})Q(z). \quad (4)$$

These are both shaped noise with a notch at $$\frac{F_s}{4}.$$

In fact $z=e^{j2\pi f/Fs}$ and both (3) and (4) are equal to 0 at $$f = \frac{F_s}{4}.$$

The spectrum for this response is qualitively depicted in FIG. 7a.

We shall now consider the effect of path mismatch, modelled by the gain elements 320,324 and 330. FIG. 8a schematically illustrates one of such gain elements, which has a real channel generally indicated 500 where the relative gain of the channel is given by 1+δ, and wherein the imaginary channel generally indicated 502 has a relative gain of (1-δ).

Thus if Y=the output signal, X=the input signal and R and I represent the real and imaginary parts, respectively, then we can write $$Y_R(n)=(1+\delta)X_R(n)$$

$$Y_I(n)=(1-\delta)X_I(n) \quad (5)$$

or in a more compact way $$Y(n)=X(n)+\delta X(n)^* \quad (6)$$

where $$X(n)=X_R(n)+JX_I(n)$$

$$X(n)^*=X_R(n)-JX_I(n)$$

$$Y(n)=Y_R(n)+JY_I(n) \quad (7)$$

* indicates the complex conjugate, and n is a clock cycle index.

Thus the above equation shows that in a gain mismatched system we obtain the desired signal X(n) plus the complex conjugate X(n)* multiplied by the mismatch co-efficient delta.

In the frequency domain, if X(f) is the Fourier transform of X(n), then X(-f) is the Fourier transform of X(n)*. Put another way, conjugation simply mirrors the power density spectrum around DC, as shown in FIG. 7b.

This means that when using the complex integrator with mismatch of FIGS. 4a and b, the error $E_I(n)$ introduced at the input of the first integrator (FIG. 4c) of a modulator of the type shown in FIG. 6 is $$E_1(z) = (\delta_{\chi 1} + \delta_{uI})X_1^*\left(\frac{1}{z}\right) + (\delta_{yI} + \delta u_1)Y_1\left(\frac{1}{z}\right) \quad (8)$$

$$= (\delta_{yI} + \delta_{uI})z^{-1}(1+jz^{-1}) + (\delta_{\chi 1} + \delta_{uI})(1-jz^{-1})^2 Q^*\left(\frac{1}{z}\right)$$

which can be approximated at $$\frac{Fs}{4}$$

as $$E_1(z) = (4(\delta_{zI} + \delta_{uI}) + 2j(\delta_{yI} + \delta_{uI}))Q^*\left(\frac{1}{z}\right) \quad (9)$$

If we assume (as is usual) that the quantization noise q(n) has a white spectrum, then also q*(n) has a white spectrum and the mismatch tends to fill the notch at $$\frac{Fs}{4}$$

with white quantization noise attenuated by the mismatch co-efficient. This is shown in FIG. 9 where the ideal notch has been filled by noise designated by the chain line 600 caused by the effect of a mismatch coefficient of 1% on the complex integrator gain elements.

However, the inventor has realised that a considerable noise improvement can be achieved if channel swappers are introduced into the sigma-delta converters. The operation of a swapper is schematically illustrated in FIGS. 10a to 10c.

The swapper 700 has a first input 702, a second input 704, a first output 706 and a second output 708, respectively. In general input 702 is an input for the "real" channel and 706 is the output for the "real" channel, and 704 is the input for the "imaginary" channel 708 is the output for the "imaginary" channel.

The swapper operates such that for one clock cycle output 706 is connected to input 702: and output 708 is connected to input 704, as shown in FIG. 10c. However on the next clock cycle output 706 is connected to input 704 whereas output 708 is connected to input 702, as shown in FIG. 10b. In the preferred embodiment of the present invention the swapper is configured as shown in FIG. 10b for odd numbered clock cycles and is configured as a straight through connection as shown in FIG. 10c for even numbered clock cycles.

If we add two swappers to the gain element of FIG. 8a, one in front, and one after the gain element, and we consider the transfer function or the resulting system shown in FIG. 8b, for clock cycle n=even $$y_R(n)=(1+\delta)X_R(n)$$

$$y_R(n)=(1-\delta)X_I(n) \quad (10)$$

while, when n is odd $$y_R(n)=(1-\delta)X_R(n)$$

$$y_R(n)=(1+\delta)X_I(n) \quad (11)$$

These equations can be summarised as $$y(n)=\chi(n)+(-1)^n \delta \chi^*(n) \quad (12)$$

This is identical to equation 6 except the conjugate of X(n) has been multiplied by the sequence $(-1)^n$ which is equivalent to mixing it with a cosine at $$\frac{Fs}{2}$$

where Fs is the sampling frequency.

This feature can be used with the sigma-delta converter described hereinbefore to reduce the noise therein.

When the conjugate noise power density spectrum shown in FIG. 7b is mixed with the cosine at $$\frac{Fs}{2}$$

as shown in FIG. 7c the quantization noise is frequency shifted such that the noise notch at $$-\frac{Fs}{4}$$

becomes shifted to $$+\frac{Fs}{4}.$$

This means that the noise no longer fills the notch at $$\frac{Fs}{4}$$

shown in FIG. 9 and the noise power becomes reduced, as shown by the solid line 604 in FIG. 9, a smooth representation of which is shown by the chain line 606. It can be seen that a noise power improvement (ie a reduction) of around 25 dB is obtained using this technique.

The scheme does not result in a theoretically infinitely deep notch at $$-\frac{Fs}{4}$$

because the output of the last integrator in the loop filter is unshaped quantization noise.

For the arrangement shown in FIG. 6, mismatch coefficients $\delta_{y2}$ and $\delta_{u2}$ of the second complex integrator introduce a disturbance $e_2(n)$ at the input of the second integrator given by $$e_2(n) = -(\delta_{y2} + \delta_{u2})(-1)^n q^*(n-2)$$

It can then be shown that this error signal appears at the output of the first integrator simply delayed by two clock cycles. Thus the output of the first integrator is no longer just shaped quantization noise, as stated by (4). When the above error signal is taken into account it can be seen that the error signal $e_1(n)$ introduced at the input of the first integrator has a component which is unshaped quantization noise and is given by $$e_1(n) = -(\delta_{y1} + \delta_{u1})(\delta_{y2} + \delta_{u2})q(n-4)$$

at $$\frac{Fs}{4}$$

this is the dominant noise contribution due to mismatch in the loop filter.

Extending the above analysis to the case of a modulator of order N where the loop filter H(z) consists of N cascaded integrators of the type shown in FIG. 4b and feed forward branches, it can be shown that the dominant residual term has the spectral power density of q(n) with an attenuation an given by:

$$\alpha_n = \prod_{i=1}^{N}(\delta_{yi} + \delta_{ui})$$

The above equation shows that the impact of mismatch is reduced as the order of the modulator increases.

Whilst loop filter H(z) in the modulator topology of FIG. 2 deals only with quantization noise, the input branches connecting the input signal $\chi$ to the two summers 204 and 208 operate only on the input signal itself. Any error introduced in the summing junction 208 in front of the analog to digital converter 210 is attenuated by the gain of the loop filter and can therefore be neglected. On the other hand any error introduced in the input summer 204 appears unattenuated at the output of the converter.

It can be shown that with a complex input signal represented by $$x(t) = Ae^{j\varphi}e^{j2\pi\left(\frac{Fs}{4}+\Delta f\right)t} \qquad (13)$$

a disturbance signal represented by $$\delta_{in}Ae^{-j\varphi}e^{j2\pi\left(\frac{Fs}{4}-\Delta f\right)t}$$

is introduced when applying the dynamic element matching by utilising swappers in accordance with the present invention where $\omega_{in}$ is the mismatch coefficient. This disturbance is a self image of the signal attenuated by $\omega_{in}$.

The feedback DAC 214, in the modulator topology of FIG. 2 deals with both the quantization noise and the input signal. In fact the input of the DAC 214 is the output of the converter, namely, in the ideal case, $Y_0(z)=X(z)+(1-jz^{-1})^2 Q(z)$ The DAC is a complex DAC, that is, in practice, it is made up of two DACs, one for the real channel and one for the imaginary channel. Ideally the two DACs have unity gain, but because of mismatch, the gain of the real DAC is $1+\omega_{DAG}$ and the gain of the imaginary DAC is $1-\omega_{DAC}$. By placing the DAC between two swappers the notch at Fs/4 is restored. If a complex input x(t) as given by (13) is provided, a self image component equal to $$\delta_{DAC}Ae^{-j\varphi}e^{j2\pi\left(\frac{Fs}{4}-\Delta f\right)t}$$

is introduced by the DAC mismatch error. Taking into account both contributions at summer 204, namely the input and the signal from the DACs, then the total self image component is equal to $$(\delta_{in} - \delta_{DAC})Ae^{-j\varphi}e^{j2\pi\left(\frac{Fs}{4}-\Delta f\right)t}.$$

Therefore the attenuation of the self image is given by:

$$\alpha_S = \delta_{in} - \delta_{DAC}$$

It should be remembered that the outputs of the DACs are subtracted from the input of the converter, as indicated by the minus sign in the previous equation. For many applications, self image attenuations of more than 25dB are sufficient, which implies matching coefficients better than 4%. This is easy to achieve in integrated circuits.

However, if the self image represents an impediment or is otherwise undesirable, it can be completely eliminated by setting $$\delta_{in} = \delta_{DAC}$$

which can be achieved in a switched capacitor circuit by using the same capacitors to sample the input (thus to implement the input branch) and to sample the reference voltage (thus implementing the feedback DACs).

FIG. 11 schematically illustrates an arrangement in which first and second channel swappers 722 and 730 respectively are introduced around a complex delta-sigma modulator 728 having mismatched channels 724 and 726. The integrators used are of the type shown in FIG. 3.

As noted hereinbefore swappers should be provided around every gain element. This is shown schematically in FIG. 12 which shows the physical realisation of FIG. 6 when interpreted using the elements as shown in FIG. 3. It can be seen that a lot of swappers are required and their inclusion, even though they are implemented as switching transistors, is best restricted as every component introduces a noise penalty and another failure mode—however small or unlikely these may be.

However, the number of swappers can be reduced using the identities shown in FIG. 13. For instance, FIG. 13a shows that the cascade of two swappers driven by the same signal sw is equivalent to a straight through connection. FIG. 13b shows that the cascade of two swappers driven by opposite signals, ($\overline{sw}$ is sw logically inverted), is the same as having a single swapper permanently turned on. FIG. 13c shows that a swapper in front of a delay block can be moved after the delay block by inverting its driving signal, and finally FIG. 13d shows that a swapper in front of a J multiplier can be moved after the J multiplier provided we multiply the output by the sequence $(-1)^{sw}$, which is equal to 1 for sw=0, and −1 for sw=1.

By applying the identities of FIG. 13 to the converter of FIG. 12, the equivalent block diagram of FIG. 14 results.

It can be seen by comparing FIG. 14 and FIG. 12 that the number of swappers has been reduced from 20 to 5.

FIG. 15 schematically shows an implementation of the converter implemented using switched capacitor technology. The arrangement show in FIG. 15 comprises six functional blocks 800, 801, 804, 805, 806 and 807 of which blocks 800 and 801 are functionally the same, blocks 804 and 805 are the same, and blocks 806 and 807 are the same. For the purposes of clarity only blocks 800 and 804 and 806 will be described in detail. Block 800 represents a four bit digital to analog converter and also one channel of a complex integrator. An operational amplifier 810 has first and second parallel capacitors 812 and 814 connected between an output of the operational amplifier and its inverting input 816. Electronically controlled switches 820 and 822 are associated with the terminal of capacitor 812 which connects to the output of the operational amplifier 810. The switch 820 is arranged to connect the terminal of the capacitor 812 to ground whereas the switch 822 is arranged to selectively connect the ternminal of the capacitor 812 to the output of the operational amplifier 810. The switch 820 is driven from a clock signal designated 1, and the switch 822 is driven from a clock signal designated 2. The interrelation between the clocks 1 and 2 is as shown in FIG. 16. The capacitor 814 is similarly surrounded by a pair of switches 824, 826, 828, 830, this time on either side of it, which are operable to either connect both terminals of the capacitor such that it becomes connected between the inverting input 816 of the amplifier 810 and its output during the period when switches 824 and 826 are closed in response to clock 1, whereas the terminals of the capacitor 814 are effectively shorted together when switches 828 and 830 are closed in response to clock 2, the switches 824 and 826 being open during this period.

The inverting input 816 of the amplifier 810 is also selectively connectable to an input array 832 via a further electronically controllable switch 834 driven from clock 2. The input stage comprises four parallel capacitors having a value c/4, each of which is connected to the respective switch interface of which only two interfaces 840 and 845 are shown and only capacitors 846 and 847 are shown. The interface 840 has electronically controllable switches 841 to 844 for selectively connecting one of the terminals of the capacitor associated therewith to either an input terminal for the real input signal XR, an input terminal for the imaginary input signal XI, a positive voltage reference +VR, and a negative voltage reference −VR.

A further input stage 860 is connected to the switch 834 via a capacitor 862 having a value of C. The input stage 860 has two inputs which may be selectively connected to the capacitor 862 via electronically operated switches 864 and 866 driven from clocks 1a and 1b, respectively.

The input stage 832 can also be selectively connected to ground via a further switch 870 driven from clock 1.

In a first phase of operation, phase 1 (when clock 1 is high) capacitor 812 is discharged by connecting one terminal to ground through switch 820 and having the other terminal permanently connected to a virtual ground, that is, the negative input of the operational amplifier 810. Also during phase 1, if clock 1a is high capacitor 862 samples the output OI1 of the first complex integrator 800, or its inverted output −OI1 if clock 1b is high. Finally, in phase 1 the four C/4 capacitors 846, 847 sample the input signal, either XR (the real part) when clock 1b is high, or XI (the imaginary part) when clock 1a is high. In a second phase of operation, phase 2 (when clock 2 is high) these capacitors 846, 847 are connected to either +Vr or −Vr, depending on the value of their controlling bit fr0,fr1,fr2 and fr3. As an example, the switch 843 is controlled by the logic AND of clock 2 (shown in FIG. 16) and the controlling bit fr0, which has been indicated as 2·fr0. When both clock 2 and fr0 are high, the switch 843 connects the associated one of the C/4 capacitors 846 to +Vr. When clock 2 is high and fr0 is low, the switch 844 connects the C/4 capacitor 846 to −Vr. The controlling bits fr0,fr1,fr2 and fr3 are generated by the ESL block 1050 in a way that will be explained in the following section. However, for sake of simplicity, it can be assumed for the time being that the ESL logic 1050 is just a straight through connection, namely that fr0=r0, fr1=r1, . . . fr3=r3, where r3,r2,r1,r0 is the output word of the quantizer 806, which is a 2 bit flash ADC. The output word of the flash converter is "thermometer" encoded. Effectively, the C/4 capacitors implement the feedback DAC, the sampling input branch and also the first summing junction of the complex sigma delta modulator. Referring to the clock diagram of FIG. 16, in phase 2 of cycle clock n, capacitor 812 is charged up to a voltage equal to the value of the integrator's output O1i plus the difference between the input XI and the quantizer output fr3,fr2,fr1,fr0. In phase 2 of cycle clock n+1, capacitor 812 is charged up to a voltage equal to the value of the integrator's inverted output −O1i plus the difference of the input XR and the quantizer 806 output fr3,fr2,fr1,fr0. Notice that in phase 2 capacitor 814 is also discharged. In the next phase, the charge across capacitor 212 is transferred to capacitor 814, thus implementing a full one period delay.

Stage 804 implements one channel of a second complex integrator and it comprises first and second capacitors 900 and 902 each selectively connectable to the inverting input 904 of an operational amplifier 906 via an electronically controllable switch 908. The complex integrator's imaginary output signal O2I and its inverse −O2I are selectively connectable to the input of the first capacitor 900 via electronically controllable switches 910 and 912, respectively. The switch 910 is driven from clock 1a whereas the switch 912 is driven from clock 1b. Similarly the first complex integrator's output signal O1I and its inverse −O1I are provided to the input capacitor 902 via switches 914 and 916, respectively. Switch 914 is driven from clock 1a and switch 916 is driven from clock 1b. The input plates of each capacitor 900 and 902 can be selectively connected to ground via switches 920 and 922 driven from clock 2. Each input capacitor 920 and 922 has a value C. The operational amplifier 906 has feedback capacitors 930 and 932, each having a value C associated with switching arrangements identical to that described hereinbefore with reference to the operational amplifier 810. The operation of stage 804 is similar to the operation of stage 800. At the end of phase 1 capacitor 900 samples either the complex integrator's output voltage O2I or its inverse −O2I, while capacitor 902 samples either the first complex integrator output voltage O1I or its inverse −O1I. In phase 1 capacitor 930 is also discharged by shorting one of its terminals to ground and by having the other terminal permanently connected to a virtual ground, namely the negative input of the operational amplifier 906. In phase 2 the charge sampled on capacitor 900 and 902 is transferred to capacitor 930. Given the equal capacitance values of capacitors 900, 902 and 930, the resulting voltage across capacitor 930 is either the sum of the complex integrator outputs O1I and O2I or the sum of their inverses −O1I and −O2I. In phase 2 capacitor 932 is also discharged. In the next phase, the charge stored on capacitor 930 is transferred to capacitor 932 thus implementing a full period delay element.

Functional block 806 comprises a flash analog to digital converter and a capacitive summer. An input to the block comprises capacitors 1002, 1004 and 1006 having values C, 2C and C, respectively, connected to a common conductor 1008. The capacitor 1002 can be selectively connected to the real and imagery input signals XR and XI via electronically controllable switches 1010 and 1012, respectively. Switch 1010 is driven from clock 1b whereas switch 1012 is driven from clock 1a. Similarly capacitor 1004 can be connected to signals −O1I and +O1I where −O1I is a negated version of +O1I. Similarly capacitor 1006 can be selectively connected via electronically controlled switches to signals −O2I and +O2I, where −O2I is a negated version of +O2I. Both capacitor plates of the capacitors 1002, 1004 and 1006 can be simultaneously connected to ground via operation of switches 1020, 1022, 1024 and 1026, all of which are driven from clock 2. The signal on the common output line 1008 is provided to four comparators 1030, 1032, 1034 and 1036 outputting signals R0, R1, R2 and R3, respectively. Each comparator receives a reference signal. The comparator 1030 receives a reference signal of −1.5 VR (where VR represents the reference signal). The comparator 1032 receives a reference of −0.5 VR, the comparator 1034 receives a reference signal of +0.5 VR and the comparator 1036 receives a reference signal of 1.5 VR. During phase 2 capacitors 1002, 1004 and 1006 are discharged. During phase 1 they are connected to either XR, −O1I and −O2I, respectively, or to XI,O1I and O2I. Consequently the voltage at node 1008 is obtained as the weighted sum of the voltages of either XR, −O1I and −O2I, or of XI,O1I and O2I. The weightings on each contribution are determined by the values of the capacitors, thus O1I or its inverse −O1I contributes twice as much as the other signals. Therefore capacitors 1002, 1004, 1006 and their associated switches implement the summing junction at the input of the quantizer. The quantizer is a 2 bit flash converter and it is sampled a the end of phase 1. The resulting output word r3,r2,r1,r0 is fed back, through the ESL logic, and it is used to control the capacitive DAC of block 800 in phase 2.

The circuit shown in FIG. 15 is single ended, though a practical implementation would be fully differential. The differential implementation makes also readily available the inversion of every signal. The timing diagram of the clocks used in the circuit of FIG. 15 is shown in FIG. 16.

The circuit of FIG. 15 uses a 2 bit ADC and DAC, but higher or lower resolution can be used. The element selection logic, ESL, block 1050 is required for ADC/DAC resolution larger than 1 bit and its role is as follows. For one bit ADC/DAC, the output of the real 1 bit ADC (namely a single comparator) r0 is directly connected to fr0, and similarly for imaginary ADC i0 is directly connected to fi0. It should be noticed that this implementation removes the self image component by using the same capacitors in the input stages 840 and 845 to sample the input signals $x_I$ and $X_R$ and the voltage reference $V_R$ and $-V_R$. For simplicity, for each DAC only 2 of the 4 feedback capacitors of value C/4 are shown. Also, the swapper at the output of the ADCs of FIG. 14 is not shown. This swapper can be implemented with multiplexers in the digital domain.

Although single bit DACs can be used, multi-bit D)DACs offer significant advantages, such as reduced quantization noise and lower dynamic range requirements for the loop filter H(z). However multi-bit DACs, which achieve the necessary accuracy, are difficult to build. In fact, though generally feedback DACs with a low number of bits (2 to 5) are used, their integral non linearity error (INL) must be lower that the desired resolution of the converter, which might be in the 10–14 bit range or higher. Usually, multi-bit DACs are built combining several 1 bit DACs of equal weight in parallel. In practice, the 1 bit DACs will have different weights because of mismatch, which causes the INL.

The DACs INL requirements can be significantly relaxed by using mismatch noise shaping techniques. The error due to the mismatch of the weights of the 1 bit DAC can be noise shaped by preceding the DACs with an appropriate Element Selection Logic (ESL). A suitable ESL to be used with the swappers scheme is shown in FIGS. 17 to 18.

Consider the system of FIG. 17a, composed of 2 swappers, a DAC 1100 for the real channel and a DAC 1102 for the imaginary channel, and the ESL 1104 and 1106 blocks driving them. The DAC R is made up of N 1 bit DACs each of weight $w_{Ri}$ and DAC I is made up of N 1 bit DACs of weight $w_{Ii}$. Ideally, $w_{Ri}=w_{Ii}=w_{av}$ for i=1 to N. In practice this is not the case. If we define the average weight $w_{av}$ as:

$$w_{av} = \left(\sum_{i=1}^{N} w_{Ri} + \sum_{i=1}^{N} w_{Ii}\right)/2N$$

then the DAC gain mismatch coefficient $\delta_{DAC}$ is given by:

$$\delta_{DAC} = \left(\frac{\sum_{i=1}^{N} w_{Ri}}{Nw_{av}}\right) - 1 = 1 - \left(\frac{\sum_{i=1}^{N} w_{Ii}}{Nw_{av}}\right)$$

the mismatch errors $\epsilon_{Ri}$ of each DAC R element are given by:

$$\varepsilon_{Ri} = \frac{w_{Ri}}{1 + \delta_{DAC}} - w_{av}$$

and finally the mismatch errors $\epsilon_{Ii}$ of each DAC I element are given by:

$$\varepsilon_{Ii} = \frac{w_{Ii}}{1 - \delta_{DAC}} - w_{av}$$

It is important to notice that from the above definition it follows that $$\sum_{i=1}^{N} \varepsilon_{Ri} = \sum_{i=1}^{N} \varepsilon_{Ii} = 0 \qquad (14)$$

For every clock cycle n, DAC R introduces an error $e_{msmR}(n)$, which is given by the sum of the $\epsilon_{Ri}$ of the elements selected to produce its output. For instance, if at n=0 the desired output of DAC R was 3 $w_{av}$, and if the first 3 elements of DAC R were selected to produce this output, then $$e_{msmR}(0) = \sum_{i=1}^{N} \varepsilon_{Ri}.$$

Similarly, DAC I introduces an error $e_{msmI}(n)$ which is given by the sum of the $\epsilon_{Ii}$ of the elements selected to produce its output. The ESL blocks and the DACs can be modelled as in FIG. 17b. Taking also the swappers 1110 and 1112 operation into account, we can see that for clock cycle index n even, the error $e(n)=e_R(n)+je_I(n)$ resulting at the output of the system of FIG. 17b) is given by, $$e_R(n) = (1+\delta_{DAC})e_{msmR}(n)$$

$$e_I(n) = (1-\delta_{DAC})e_{msmI}(n)$$

while for clock index n odd we have $$e_R(n) = (1+\delta_{DAC})e_{msmI}(n)$$

$$e_I(n) = (1+\delta_{DAC})e_{msmR}(n)$$

It is desirable to shape the mismatch noise e(n) such that it has minimum power in the bandwidth of interest, namely around Fs/4. It can be shown that the power spectral density of e(n) is 0 at Fs/4, if the partial sum $$\left|\sum_{n=0}^{M} e(n)e^{-j\frac{\pi}{2}n}\right|$$ is bound in magnitude by some constant K for any M. Namely:

$$\left|\sum_{n=0}^{M} e(n)e^{-j\frac{\pi}{2}n}\right| < K \text{ for any } M. \qquad (15)$$

For instance, for M=3, the above partial sum for the system of FIG. 16b is given by:

$$\sum_{n=0}^{3} e(n)e^{-j\frac{\pi}{2}n} = (1+\delta_{DAC})(e_{msmR}(0) + e_{msmR}(1) - e_{msmR}(2) - \qquad (16)$$

$$e_{msmR}(3)) + j(1-\delta_{DAC})(e_{msmI}(0) - e_{msmI}(1) -$$

$$-e_{msmI}(2) + e_{msmI}(3))$$

Condition (15) can be met with the selection pattern shown in FIG. 17c, which is similar to the selection pattern used in the mismatch noise shaping technique known as data weighted averaging (DWA). The numbers on the y (vertical) axis of the tables represent the DACs input, while the shaded squares represent the elements selected to produce the DAC desired output for that input. The case of a 3 bit (8 unit elements) DAC is shown. Let's consider the selection pattern of DAC R, (namely the left hand table of FIG. 17c). It can be observed that the elements corresponding to clock cycle index 0,1,4,5,8,9 and so on are selected in a sequential manner as will be discussed below. Assume that the first row of the table corresponds to clock cycle n=0. So, from the table, at clock cycle n=0 the input is 3 and the desired output is, ideally, $3w_{av}$. As shown by the first row, the first 3 elements are selected. At n=1, the input is 1 and the next element is selected. Ignore for the time being the inputs at n=2 and n=3 and observe that at n=4 the input of DAC R is 5, and the next 5 elements are selected. Notice that once the end of the unit elements array is reached, as for n=4, the first elements of the array are selected again. Essentially, the elements are selected sequentially in a rotational fashion where the first unit element follows the last one. It can be observed that also the elements of DAC R corresponding to clock cycles n=2,3,6,7,9,10 and so on are selected sequentially in a rotational fashion, but they are selected according to an independent sequence from the elements corresponding to the other clock cycles. The number of elements selected depends on the output of the flash converter itself, thereby giving a random selection of elements.

Similarly, by analysing the selection pattern of the DAC I elements it can be concluded that these too are selected in a rotational fashion according to two independent sequences. However, now the elements corresponding to clock cycles 0,3,4,7,8 and so on belong to a first rotational sequence, and the elements corresponding to clock cycles 1,2,5,6,9,10 and so on belong to a second rotational sequence.

This particular selection pattern meets the condition stated by (15) in the following manner. Consider the real part of $$\sum_{n=0}^{M} e(n)e^{-j\frac{\pi}{2}n},$$

which, as it can be seen by (16), corresponds to the contribution of DAC R. At clock cycle n=0 the input is 3 and the desired output is, ideally, 3 $w_{av}$. As shown by the first row, the first 3 elements are selected and thus real part of $$\sum_{n=0}^{M} e(n)e^{-j\frac{\pi}{2}n}$$

at n=0, M=0 is $(1+\delta_{DAC})e_{msmR}(0)=(1+\delta_{DAC})(\epsilon_{R1}+\epsilon_{R2}+\epsilon_{R3}).$ At the next clock cycle, the input is 1, and the fourth element of DAC R is selected. Thus, the real part of $$\sum_{n=0}^{M} e(n)e^{-j\frac{\pi}{2}n}$$

at M=1 is $(1+\delta_{DAC})(e_{msmR}(0)+e_{msmR}(1))=(1+\delta_{DAC})(\epsilon_{R1}+\epsilon_{R2}+\epsilon_{R3}+\epsilon_{R4})$ At clock cycle index 2, the input is 2, and the first 2 elements of DAC R are selected again. This is advantageous because the error contribution at this cycle (and at the next one) is subtracted, not added, as clearly shown in (16). This reduces thus the real part of the partial sum $$\sum_{n=0}^{M} e(n)e^{-j\frac{\pi}{2}n}$$

at M=3 to:

$(1+\delta_{DAC})(e_{msmR}(0)+e_{msmR}(1)-e_{msmR}(2))=(1+\delta_{DAC})(\epsilon_{R3}+\epsilon_{R4}).$ At clock cycle index n=3 the input is 4, and the elements from the 3rd to the 6th are selected, and thus at M=4, $$\sum_{n=0}^{M} e(n)e^{-j\frac{\pi}{2}n} = (1+\delta_{DAC})(e_{msmR}(0)+e_{msmR}(1)-e_{msmR}(2)-$$

$$e_{msmR}(3))$$

$$= (1+\delta_{DAC})(-\epsilon_{R5}-\epsilon_{R6})$$

At clock cycle index n=4 the input is 5, and the elements from the 5$^{th}$ to the 8th are selected, and also the first element is selected again. Thus at M=4, $$\sum_{n=0}^{M} e(n)e^{-j\frac{\pi}{2}n} = (1+\delta_{DAC})(e_{msmR}(0)+e_{msmR}(1)-e_{msmR}(2)-$$

$$e_{msmR}(3)+e_{msmR}(4))$$

$$= (1+\delta_{DAC})(\epsilon_{R1}+\epsilon_{R7}+\epsilon_{R8})$$

Continuing the above analysis it turns out that the effect of the selection scheme is to have one and only one net contribution for any value of M of any of the DAC R errors $\epsilon_{Ri}$ to the result of the partial sum $$\sum_{n=0}^{M} e(n)e^{-j\frac{\pi}{2}n},$$

thus keeping it bounded. A similar analysis for the contribution of DAC I shows that the net effect of the shown selection scheme is to have one and only one contribution for any value of M of any of the DAC I errors $\epsilon_{Ii}$ to the net result of the partial sum $$\sum_{n=0}^{M} e(n)e^{-j\frac{\pi}{2}n},$$

thus keeping also the imaginary part of this sum bounded.

A practical implementation of the ESL producing this selection pattern is shown in FIG. 18 and its clocking scheme is shown in FIG. 19. The implementation shown in FIG. 18 can be used for the converter of FIG. 15. Consider FIG. 18a, which determines the selected elements for the DAC R. For the switched capacitor implementation of FIG. 15, the DAC unit elements are the capacitors with values C/4. When one capacitor is selected, it is connected to +VR in phase 2, otherwise if it is not selected it is connected to −VR during phase 2. The ADC output word r3,r2,r1,r0 is fed to a barrel shifter 1201. The output of the barrel shifter is the word controlling the DAC R, namely fr3,fr2,fr1,fr0. A pointer that determines the shift that the barrel shifter 1201 applies to its input word r3,r2,r1,r0 to produce its output word fr3,fr2,fr1,fr0 is obtained from the appropriate selection through multiplexer 1205 of the output of two registers 1202 and 1203. The current shift value and the current input, binary encoded through encoder 1200, are added by adder 1204 and selectively stored in one of the two 2 bit registers. The selection of the register is implemented by selectively clocking the desired register, as shown in the clock scheme of FIG. 19. The registers are updated on the rising edge of their clocks. FIG. 19 also shows the signal "sel_a" that drives multiplexer 1205. When sel_a is high, the multiplexer output is the output of register 1202, while when sel_a is low, it is the output of register 1203. The need for two separate registers is due to the requirements for two independent rotational sequences. The addition is performed modulo 4, so that when the last array capacitor has been reached, the first capacitor can be selected again. For instance, as shown from the timing diagram of FIG. 19, at clock cycle 0 the output of register 1202 is selected to drive the shift input of the barrel shifter. The output of adder 1204 is the sum of the input word r3,r2,r1,r0, binary converted, and of the current shift applied to barrel shifter 1201. This number points to the next unused values of the DAC and it is stored at the end of clock cycle 0, by the rising edge of clk_a1, into register 1202. This value is the value used during clock cycle 1 to shift the input data r3,r2,r1,r0. Again, the output of adder 1204 is the sum of the input word r3,r2,r1,r0, binary converted, and of the current shift applied to barrel shifter 1201, which points to the next unused element, and it is stored in register 1202 at the end of clock cycle 1 by the rising edge of clk_a1. However, this value is not used to drive the barrel shifter till clock cycle 4. During clock cycles 2 and 3, the output of register 1203 is used instead. So, register 1202 provides the shift for the rotational sequence of clock cycles 0,1,3,4,7,8 and so on while register 1203 produces the shift for the rotational sequence of clock cycles 2,3,5,6,9,10 and so on. FIG. 18b shows a circuit similar to that shown in FIG. 18a, but for use with the imaginary channel of the converter.

What is claimed is:

1. A signal processing apparatus having first and second signal processing channels, the first and second channels having gain element pairs therein which are substantially matched between the first and second channels, and wherein gain elements in the first and second channels which form a substantially matched pair between the first and second channels are preceded by a first gain element swapper and followed by a second gain element swapper, wherein the first and second gain element swappers are operated so as to alternatively swap the substantially matched pair of gain elements between the first and second channels.

2. A signal processing apparatus as claimed in claim 1 where each gain element is preceded and succeeded by an associated pair of swappers.

3. An apparatus as claimed in claim 1 where gain elements are grouped into functional blocks, and each functional block is preceded and followed by an associated pair of swappers.

4. An apparatus as claimed in claim 1, where a reduced number of swappers are provided by omitting redundant swappers.

5. A signal processing apparatus as claimed in claim 1, in which the signal processing channels have the signal band of interest centred about a frequency $F_1$, and the swappers operate to swap the channels at a frequency $F_2$ which is substantially twice $F_1$.

6. A signal processing apparatus as claimed in claim 5, in which the signal processing channels comprise analog to digital converters including a feedback loop and a filter such that quantization noise is rejected at frequency $F_1$.

7. A signal processing apparatus as claimed in claim 6, wherein the analog to digital converter is a sigma-delta converter.

8. A signal processing apparatus as claimed in claim 7, wherein noise shaping around a digital to analog converter within the sigma-delta converter is performed so as to change the frequency spectrum of the digital to analog converter mismatch noise.

9. A signal processing device having first and second processing devices and first and second signal channels, wherein the first and second processing devices are proceeded and followed by switching devices such that, in a repeated fashion, the first signal processing device is introduced into the first signal processing channel and the second signal processing device is introduced into the second processing channel, and then the first signal processing device is introduced into the second signal channel and the second signal processing device is introduced into the first signal channel.

10. A signal processing apparatus as claimed in claim 9, where each processing device is preceded and succeeded by an associated pair of swappers.

11. An apparatus as claimed in claim 9, where processing devices are grouped into functional blocks, and each functional block is preceded and followed by an associated pair of swappers.

12. An apparatus as claimed in claim 9, where a reduced number of swappers are provided by omitting redundant swappers.

13. A signal processing apparatus as claimed in claim 9, in which the signal processing channels have the signal band of interest centred about frequency $F_1$, and the swappers operate to swap the channels at a frequency $F_2$ which is substantially twice $F_1$.

14. A signal processing apparatus as claimed in claim 13, in which the signal processing channels comprise analog to digital converters including a feedback loop and a filter such that quantization noise is rejected at $F_1$.

15. A signal processing apparatus as claimed in claim 14, wherein the analog to digital converter is a sigma-delta converter.

16. A signal processing apparatus as claimed in claim 13, wherein noise shaping around a digital to analog converter within the sigma-delta converter is performed so as to change the frequency spectrum of the digital to analog converter mismatch noise.

17. A signal processing device as claimed in claim 15, further comprising switched capacitors.

18. A signal processing device as claimed in claim 17, further comprising a selection controller for selecting which of the capacitors to use at a given time so as to shape mismatch noise within a digital to analog converter.

19. A method of processing complex signals in a signal processing circuit having a first channel and a second channel for "real" and "imaginary" parts of the signal, and wherein the effects of channel mismatch are reduced by repeatedly swapping signal paths in the first and second channels such that a signal processing element belongs to the first channel and the second channel in an alternating manner.

* * * * *